United States Patent
Wang et al.

(10) Patent No.: US 10,515,700 B2
(45) Date of Patent: Dec. 24, 2019

(54) SEMICONDUCTOR STORAGE DEVICE AND MEMORY SYSTEM

(71) Applicant: TOSHIBA MEMORY CORPORATION, Tokyo (JP)

(72) Inventors: Weihan Wang, Tokyo (JP); Takahiro Shimizu, Yokohama Kanagawa (JP); Noboru Shibata, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/164,622

(22) Filed: Oct. 18, 2018

(65) Prior Publication Data

US 2019/0267090 A1 Aug. 29, 2019

(30) Foreign Application Priority Data

Feb. 27, 2018 (JP) .................................. 2018-032989
Oct. 10, 2018 (JP) .................................. 2018-192037

(51) Int. Cl.
G11C 16/04 (2006.01)
G11C 11/56 (2006.01)
G11C 16/08 (2006.01)
H03M 13/29 (2006.01)
G06F 11/10 (2006.01)
G11C 16/34 (2006.01)

(52) U.S. Cl.
CPC ...... *G11C 16/0483* (2013.01); *G06F 11/1048* (2013.01); *G06F 11/1068* (2013.01); *G06F 11/1072* (2013.01); *G11C 11/5628* (2013.01); *G11C 11/5642* (2013.01); *G11C 16/08* (2013.01); *G11C 16/3459* (2013.01); *H03M 13/2906* (2013.01)

(58) Field of Classification Search
CPC ............ G11C 16/0483; G11C 11/1048; G11C 11/1068
USPC ........................................ 365/185.03, 185.17
See application file for complete search history.

(56) References Cited

U.S. PATENT DOCUMENTS

| 8,605,500 | B2 | 12/2013 | Kobayashi et al. | |
| 2017/0364408 | A1* | 12/2017 | Sherman | ............. G06F 13/4022 |
| 2018/0075902 | A1* | 3/2018 | Shirakawa | .......... G06F 11/1068 |

FOREIGN PATENT DOCUMENTS

JP  2012-48791 A  3/2012

* cited by examiner

*Primary Examiner* — Han Yang
(74) *Attorney, Agent, or Firm* — Kim & Stewart LLP

(57) ABSTRACT

A semiconductor storage device includes a first memory string having first, second, and third memory cells and a first select transistor, a second memory string having fourth, fifth, and sixth memory cells and a second select transistor, a third memory string having seventh, eighth, and ninth memory cells and a third select transistor, a first word line connected to gates of the first, fourth, and seventh memory cells, a second word line connected to gates of the second, fifth, and eighth memory cells, and a third word line connected to gates of the third, sixth, and ninth memory cells. A write operation for writing multi-bit data in the memory cells includes first and second write operations. In the second write operations performed through the first, second, and third word lines, respective ones of the first, fifth, and ninth memory cell are initially selected.

20 Claims, 28 Drawing Sheets

| | | ORDER OF SECOND WRITE OPERATION | | | |
|---|---|---|---|---|---|
| | | 1 | 2 | 3 | 4 |
| WG | WL(i+3) | SU3 | SU0 | SU1 | SU2 |
| | WL(i+2) | SU2 | SU3 | SU0 | SU1 |
| | WL(i+1) | SU1 | SU2 | SU3 | SU0 |
| | WLi | SU0 | SU1 | SU2 | SU3 |

▨ : SU0

| | | SU0 | SU1 | SU2 | SU3 |
|---|---|---|---|---|---|
| WL95 | | | | | |
| ... | | | | | |
| WL7 | WRT2 | | | | |
| | WRT1 | 57 | 59 | 53 | 55 |
| WL6 | WRT2 | 58 | 60 | 54 | 56 |
| | WRT1 | 51 | 45 | 47 | 49 |
| WL5 | WRT2 | 52 | 46 | 48 | 50 |
| | WRT1 | 37 | 39 | 41 | 43 |
| WL4 | WRT2 | 38 | 40 | 42 | 44 |
| | WRT1 | 31 | 33 | 35 | 29 |
| WL3 | WRT2 | 32 | 34 | 36 | 30 |
| | WRT1 | 25 | 27 | 21 | 23 |
| WL2 | WRT2 | 26 | 28 | 22 | 24 |
| | WRT1 | 19 | 13 | 15 | 17 |
| WL1 | WRT2 | 20 | 14 | 16 | 18 |
| | WRT1 | 5 | 7 | 9 | 11 |
| WL0 | WRT2 | 6 | 8 | 10 | 12 |
| | WRT1 | 1 | 2 | 3 | 4 |

WG1: WL7–WL4
WG0: WL3–WL0

: SU FOR WHICH SECOND WRITE OPERATION IS INITIALLY SELECTED

| | | ORDER OF SECOND WRITE OPERATION | | | |
|---|---|---|---|---|---|
| | | 1 | 2 | 3 | 4 |
| WG | WL(i+3) | SU3 | SU0 | SU1 | SU2 |
| | WL(i+2) | SU2 | SU3 | SU0 | SU1 |
| | WL(i+1) | SU1 | SU2 | SU3 | SU0 |
| | WLi | SU0 | SU1 | SU2 | SU3 |

; SU0

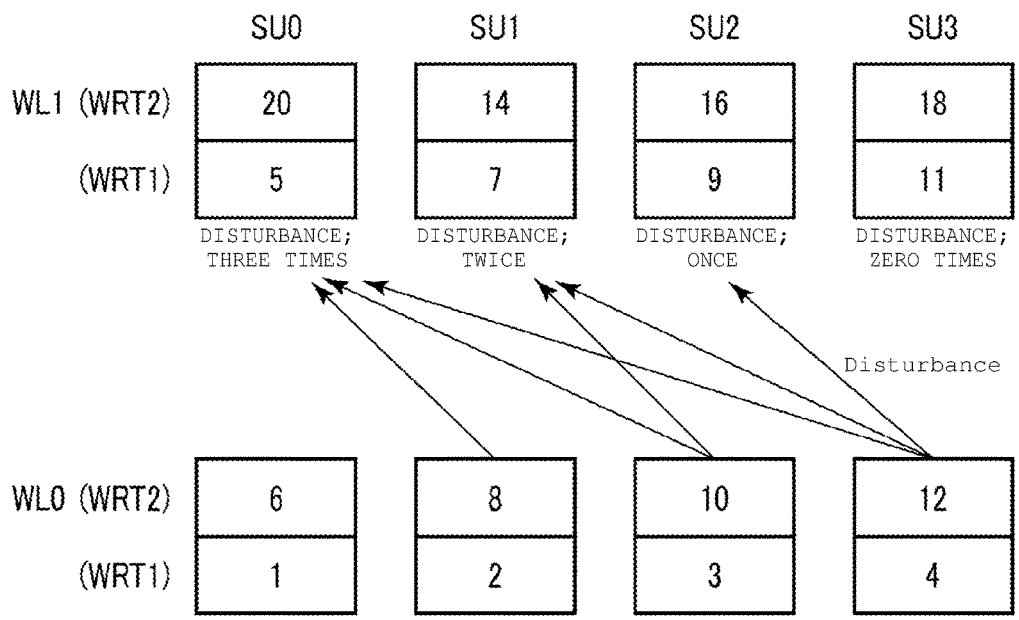

| | | ORDER OF SECOND WRITE OPERATION | | | |
|---|---|---|---|---|---|
| | | 1 | 2 | 3 | 4 |
| WG | WL(i+3) | SU1 | SU0 | SU3 | SU0 |
| | WL(i+2) | SU2 | SU3 | SU0 | SU1 |
| | WL(i+1) | SU3 | SU0 | SU1 | SU2 |
| | WLi | SU0 | SU1 | SU2 | SU3 |

; SU0

| | | ORDER OF SECOND WRITE OPERATION | | | |
|---|---|---|---|---|---|
| | | 1 | 2 | 3 | 4 |
| WG | WL(i+3) | SU1 | SU2 | SU3 | SU0 |
| | WL(i+2) | SU3 | SU0 | SU1 | SU2 |
| | WL(i+1) | SU2 | SU3 | SU0 | SU1 |
| | WLi | SU0 | SU1 | SU2 | SU3 |

; SU0

|  |  | ORDER OF SECOND WRITE OPERATION | | | |
|---|---|---|---|---|---|
|  |  | 1 | 2 | 3 | 4 |
| WG(j+1) | WL(i+7) | SU1 | SU2 | SU3 | SU0 |
| | WL(i+6) | SU3 | SU0 | SU1 | SU2 |
| | WL(i+5) | SU2 | SU3 | SU0 | SU1 |
| | WL(i+4) | SU0 | SU1 | SU2 | SU3 |
| WGj | WL(i+3) | SU1 | SU2 | SU3 | SU0 |
| | WL(i+2) | SU2 | SU3 | SU0 | SU1 |
| | WL(i+1) | SU3 | SU0 | SU1 | SU2 |
| | WLi | SU0 | SU1 | SU2 | SU3 |

LOWER BLOCK

| | | SU0 | SU1 | SU2 | SU3 |
|---|---|---|---|---|---|
| WL47 | WRT2 | 6 | 8 | 10 | 12 |
| | WRT1 | 1 | 2 | 3 | 4 |
| WL46 | WRT2 | 20 | 14 | 16 | 18 |
| | WRT1 | 5 | 7 | 9 | 11 |
| WL45 | WRT2 | 26 | 28 | 22 | 24 |
| | WRT1 | 19 | 13 | 15 | 17 |
| WL44 | WRT2 | 32 | 34 | 36 | 30 |
| | WRT1 | 25 | 27 | 21 | 23 |
| WL43 | WRT2 | 38 | 40 | 42 | 44 |
| | WRT1 | 31 | 33 | 35 | 29 |
| WL42 | WRT2 | 52 | 46 | 48 | 50 |
| | WRT1 | 37 | 39 | 41 | 43 |
| WL41 | WRT2 | | | | |
| | WRT1 | 51 | 45 | 47 | 49 |
| ... | | | | | |
| WL0 | | | | | |

UPPER BLOCK

| | | SU0 | SU1 | SU2 | SU3 |
|---|---|---|---|---|---|
| WL95 | | | | | |
| | WRT2 | | | | |
| ... | | | | | |
| WL54 | WRT2 | | | | |
| | WRT1 | 51 | 45 | 47 | 49 |
| WL53 | WRT2 | 52 | 46 | 48 | 50 |
| | WRT1 | 37 | 39 | 41 | 43 |
| WL52 | WRT2 | 38 | 40 | 42 | 44 |
| | WRT1 | 31 | 33 | 35 | 29 |
| WL51 | WRT2 | 32 | 34 | 36 | 30 |
| | WRT1 | 25 | 27 | 21 | 23 |
| WL50 | WRT2 | 26 | 28 | 22 | 24 |
| | WRT1 | 19 | 13 | 15 | 17 |
| WL49 | WRT2 | 20 | 14 | 16 | 18 |
| | WRT1 | 5 | 7 | 9 | 11 |
| WL48 | WRT2 | 6 | 8 | 10 | 12 |
| | WRT1 | 1 | 2 | 3 | 4 |

: SU FOR WHICH SECOND WRITE OPERATION IS INITIALLY SELECTED

| | | SU0 | SU1 | SU2 | SU3 |
|---|---|---|---|---|---|
| WL95 | WRT3 | | | | |
| | WRT2 | | | | |
| | WRT1 | | | | |
| ... | WRT3 | | | | |
| | WRT2 | | | | |
| | WRT1 | | | | |
| WL6 | WRT3 | | | | |
| | WRT2 | | | | |
| | WRT1 | 61 | 64 | 67 | 70 |
| WL5 | WRT3 | | | | |
| | WRT2 | 62 | 65 | 68 | 71 |
| | WRT1 | 52 | 55 | 58 | 49 |
| WL4 | WRT3 | ▨63▨ | 66 | 69 | 72 |
| | WRT2 | 53 | 56 | 59 | 50 |
| | WRT1 | 43 | 46 | 37 | 40 |
| WL3 | WRT3 | 54 | 57 | 60 | ▨51▨ |
| | WRT2 | 44 | 47 | 38 | 41 |
| | WRT1 | 34 | 25 | 28 | 31 |
| WL2 | WRT3 | 45 | 48 | ▨39▨ | 42 |
| | WRT2 | 35 | 26 | 29 | 32 |
| | WRT1 | 7 | 12 | 17 | 22 |
| WL1 | WRT3 | 36 | ▨27▨ | 30 | 33 |
| | WRT2 | 8 | 13 | 18 | 23 |
| | WRT1 | 5 | 10 | 15 | 20 |
| WL0 | WRT3 | ▨9▨ | 14 | 19 | 24 |
| | WRT2 | 6 | 11 | 16 | 21 |
| | WRT1 | 1 | 2 | 3 | 4 |

WG0 brackets WL0–WL3.

; SU FOR WHICH THIRD WRITE OPERATION IS INITIALLY SELECTED

|  |  | SU0 | SU1 | SU2 | SU3 |
|---|---|---|---|---|---|
| WL95 (SLC) | WRT1 | k-1 | k-7 | k-5 | k-3 |
| WL94 | WRT2 | k | k-6 | k-4 | k-2 |
|  | WRT1 | k-15 | k-13 | k-11 | k-9 |
| WL93 | WRT2 | k-14 | k-12 | k-10 | k-8 |
|  | WRT1 | k-21 | k-19 | k-17 | k-23 |
| WL92 | WRT2 | k-20 | k-18 | k-16 | k-22 |
|  | WRT1 |  |  |  |  |
| ... | WRT2 |  |  |  |  |
|  | WRT1 |  |  |  |  |
| WL3 | WRT2 |  |  |  |  |
|  | WRT1 | 23 | 17 | 19 | 21 |
| WL2 | WRT2 | 24 | 18 | 20 | 22 |
|  | WRT1 | 9 | 11 | 13 | 15 |
| WL1 | WRT2 | 10 | 12 | 14 | 16 |
|  | WRT1 | 5 | 6 | 7 | 8 |
| WL0 (SLC) | WRT1 | 1 | 2 | 3 | 4 |

: SU FOR WHICH SECOND WRITE OPERATION IS INITIALLY SELECTED

FIG. 30

| | | LOWER BLOCK | | | |
|---|---|---|---|---|---|
| | | SU0 | SU1 | SU2 | SU3 |
| WL47 (SLC) | WRT1 | 1 | 2 | 3 | 4 |
| WL46 | WRT2 | 10 | 12 | 14 | 16 |
| | WRT1 | 5 | 6 | 7 | 8 |
| WL45 | WRT2 | 24 | 18 | 20 | 22 |
| | WRT1 | 9 | 11 | 13 | 15 |
| WL44 | WRT2 | 23 | 17 | 19 | 21 |
| | WRT1 | | | | |
| ... | WRT2 | | | | |
| | WRT1 | | | | |
| WL3 | WRT2 | k−20 | k−18 | k−16 | k−22 |
| | WRT1 | k−14 | k−12 | k−10 | k−8 |
| WL2 | WRT2 | k−21 | k−19 | k−17 | k−23 |
| | WRT1 | k | k−6 | k−4 | k−2 |
| WL1 | WRT2 | k−15 | k−13 | k−11 | k−9 |
| | WRT1 | k−1 | k−7 | k−5 | k−3 |
| WL0 (SLC) | WRT1 | | | | |

| | | UPPER BLOCK | | | |
|---|---|---|---|---|---|
| | | SU0 | SU1 | SU2 | SU3 |
| WL95 (SLC) | WRT1 | k−1 | k−7 | k−5 | k−3 |
| WL94 | WRT2 | k | k−6 | k−4 | k−2 |
| | WRT1 | k−15 | k−13 | k−11 | k−9 |
| WL93 | WRT2 | k−14 | k−12 | k−10 | k−8 |
| | WRT1 | k−21 | k−19 | k−17 | k−23 |
| WL92 | WRT2 | k−20 | k−18 | k−16 | k−22 |
| | WRT1 | | | | |
| ... | WRT2 | | | | |
| | WRT1 | | | | |
| WL51 | WRT2 | 23 | 17 | 19 | 21 |
| | WRT1 | | | | |
| WL50 | WRT2 | 24 | 18 | 20 | 22 |
| | WRT1 | 9 | 11 | 13 | 15 |
| WL49 | WRT2 | 10 | 12 | 14 | 16 |
| | WRT1 | 5 | 6 | 7 | 8 |
| WL48 (SLC) | WRT1 | 1 | 2 | 3 | 4 |

▨ : SU FOR WHICH SECOND WRITE OPERATION IS INITIALLY SELECTED

SEMICONDUCTOR STORAGE DEVICE AND MEMORY SYSTEM

CROSS-REFERENCE TO RELATED APPLICATIONS

This application is based upon and claims the benefit of priority from Japanese Patent Application No. 2018-032989, filed Feb. 27, 2018, and Japanese Patent Application No. 2018-192037, filed Oct. 10, 2018; the entire contents of these applications are incorporated herein by reference.

FIELD

Embodiments described herein relate generally to a semiconductor storage device and a memory system.

BACKGROUND

NAND flash memories have been known as semiconductor storage devices.

DESCRIPTION OF THE DRAWINGS

FIG. 16 is a diagram illustrating an example of the number of disturbances applied to other string units due to the second write operation.

FIG. 17 is a diagram illustrating an example of the number of disturbances applied to other string units due to the second write operation for each memory cell group.

FIG. 21 is a diagram illustrating an order of writing data into a block of a semiconductor storage device according to a third embodiment.

FIG. 30 is a diagram illustrating an order of writing data into a block of a semiconductor storage device according to a seventh embodiment.

DETAILED DESCRIPTION

Figure 1:
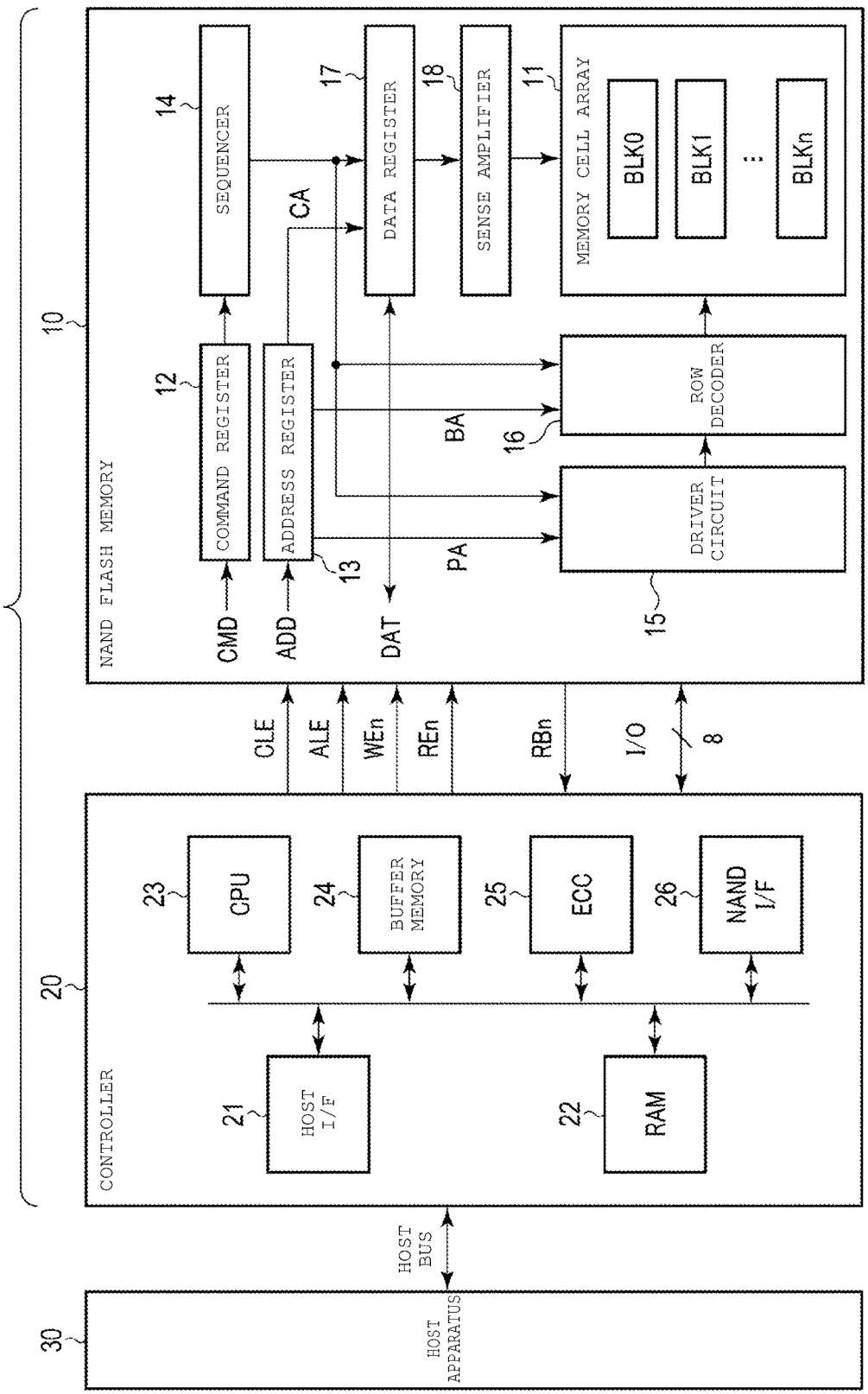
FIG. 1 is a block diagram of a memory system according to a first embodiment.

Embodiments provide a semiconductor storage device and a memory system capable of improving reliability.

In general, according to one embodiment, there is provided a semiconductor storage device including a first memory string having first, second, and third memory cells and a first select transistor, a second memory string having fourth, fifth, and sixth memory cells and a second select transistor, a third memory string having seventh, eighth, and ninth memory cells and a third select transistor, a first word line that is connected to gates of the first, fourth, and seventh memory cells, a second word line that is connected to gates of the second, fifth, and eighth memory cells, a third word line that is connected to gates of the third, sixth, and ninth memory cells, first, second, and third select gate lines that are respectively connected to the first, second, and third select transistors, and a row decoder that is connected to the first, second, and third word lines and the first, second, and third select gate lines. A write operation for writing n-bit data in the memory cells, where n is two or more, includes a first write operation and a second write operation, such that, in the second write operation performed on the memory cells connected to the first word line, the first memory cell is initially selected, in the second write operation performed on the memory cells connected to the second word line, the fifth memory cell is initially selected, and, in the second write operation performed on the memory cells connected to the third word line, the ninth memory cell is initially selected.

Hereinafter, embodiments will be described with reference to the drawings. In the description thereof, elements having the substantially same function and configuration are given the same reference numeral. Each embodiment described below is given as an example of an apparatus or a method that embodies the technical spirit of the embodiment, and these examples do not limit a material, a shape, a structure, and an arrangement of constituent components. The technical spirit of the embodiments may be modified in various manner within the scope of the claims.

1. First Embodiment

A semiconductor storage device according to a first embodiment will be described. Herein, a three-dimensional stacked NAND flash memory in which a memory cell transistor is stacked over a semiconductor substrate is described as an example of the semiconductor storage device.

1.1 Configuration 1.1.1 Configuration of Memory System

First, the entire configuration of a memory system 1 will be described with reference to FIG. 1. In the example illustrated in FIG. 1, some connections among respective blocks are indicated by arrow lines, but connections among the respective blocks are not limited thereto.

As illustrated in FIG. 1, the memory system 1 includes a semiconductor storage device 10 and a controller 20, and is connected to an external host apparatus 30. The controller 20 and the semiconductor storage device 10 may be combined into a single semiconductor storage device, and, as an example thereof, there may be a memory card such as an SD™ card, or a solid state drive (SSD).

In response to a command from the host apparatus 30, the controller 20 instructs the semiconductor storage device 10 to perform a data read operation, a data write operation, and a data erasing operation. The controller 20 manages a memory space of the semiconductor storage device 10.

The controller 20 includes a host interface circuit 21, an internal memory (RAM) 22, a processor (CPU) 23, a buffer memory 24, an ECC circuit 25, and a NAND interface circuit 26.

The host interface circuit 21 is connected to the host apparatus 30 via a host bus, and performs communication with the host apparatus 30. For example, the host interface circuit 21 transmits a command and data received from the host apparatus 30 to the CPU 23 and the buffer memory 24, respectively. The host interface circuit 21 transmits data in the buffer memory 24 to the host apparatus 30 in response to a command from the CPU 23.

The RAM 22 is a semiconductor memory such as a DRAM, and stores firmware for managing the semiconductor storage device 10, or various management tables. The RAM 22 is used as a work area of the CPU 23.

The CPU 23 controls the entire operation of the controller 20. For example, the CPU 23 issues a write command to the NAND interface circuit 26 in response to a write command received from the host apparatus 30. This operation is also the same for cases of a read command and an erasing command. The CPU 23 performs various processes for managing a memory space of the semiconductor storage device 10, such as wear-leveling.

The buffer memory 24 temporarily stores read data received from the semiconductor storage device 10 by the controller 20 or write data received from the host apparatus 30.

The ECC circuit 25 performs a data error checking and correcting (ECC) process. Specifically, the ECC circuit 25 generates a parity on the basis of write data during writing of data. The ECC circuit 25 detects an error by generating a syndrome from the parity during reading of data, and corrects the detected error.

The NAND interface circuit 26 is connected to the semiconductor storage device 10 via a NAND bus, and performs communication with the semiconductor storage device 10. Signals transmitted and received between the semiconductor storage device 10 and the controller 20 conform to a NAND interface standard. For example, the NAND interface circuit 26 transmits a command latch enable signal CLE, an address latch enable signal ALE, a write enable signal WEn, and a read enable signal REn to the semiconductor storage device 10 on the basis of commands received from the CPU 23, receives a ready/busy signal RBn from the semiconductor storage device 10, and transmits and receives an input/output signal I/O to and from the semiconductor storage device 10.

The signals CLE and ALE are signals for notifying the semiconductor storage device 10 that input signals I/O to the semiconductor storage device 10 are respectively a command CMD and address information ADD. The signal WEn is asserted in an "L" level, and enables the input signals I/O to be incorporated into the semiconductor storage device 10. The signal REn is also asserted in an "L" level, and enables an output signal I/O from the semiconductor storage device 10 to be read.

The ready/busy signal RBn is a signal for performing a notification of whether or not the semiconductor storage device 10 can receive a command from the controller 20. The ready/busy signal RBn has an "H" level in a ready state in which the semiconductor storage device 10 can receive a command from the controller 20, and has an "L" level in a busy state in which the semiconductor storage device 10 cannot receive a command therefrom.

The input/output signal I/O is, for example, an 8-bit signal, and may include the command CMD, the address information ADD, and data DAT. For example, during a write operation, the input/output signal I/O transmitted to the semiconductor storage device 10 includes the write command CMD issued by the CPU 23, the address information ADD, and the data DAT to be written to the buffer memory 24. During a read operation, the input/output signal I/O transmitted to the semiconductor storage device 10 includes the read command CMD and the address information ADD, and the input/output signal I/O transmitted to the controller 20 includes the read data DAT.

The host apparatus 30 using the above-described memory system 1 may be, for example, a digital camera or a personal computer.

Next, a description will be made of a configuration of the semiconductor storage device 10. The semiconductor storage device 10 includes a memory cell array 11, a command register 12, an address register 13, a sequencer 14, a driver circuit 15, a row decoder 16, a data register 17, and a sense amplifier 18.

The memory cell array 11 includes a plurality of blocks BLK0 to BLKn (where n is an integer of 1 or more). The block BLK is a set of a plurality of nonvolatile memory cell transistors associated with bit lines and word lines, and is, for example, the data erasing unit.

The command register 12 stores the command CMD received from the controller 20. The address register 13 stores the address information ADD received from the controller 20. The address information ADD includes a column address CA, a page address PA, and a block address BA.

The sequencer 14 controls the entire operation of the semiconductor storage device 10 on the basis of the command CMD held in the command register 12. Specifically, the sequencer 14 controls the driver circuit 15, the row decoder 16, the data register 17, the sense amplifier 18, and the like on the basis of the command CMD, and thus performs a data write operation, a data read operation, and the like.

The driver circuit 15 generates voltages on the basis of an instruction from the sequencer 14. The driver circuit 15 supplies the generated voltage to the row decoder 16 on the basis of the page address PA held in the address register 13.

The row decoder 16 selects any one of the blocks BLK0 to BLKn on the basis of the block address BA held in the address register 13. The row decoder 16 selects a row direction in the selected block BLK, and applies the voltage supplied from the driver circuit 15 to a selected word line.

The data register 17 includes a plurality of latch circuits. Each of the latch circuits temporarily stores data. For example, in a write operation, the data register 17 temporarily stores write data received via an input/output circuit (not illustrated), and transmits the write data to the sense amplifier 18. For example, in a read operation, the data register 17 temporarily stores read data received from the sense amplifier 18, and transmits the read data to the controller 20 via the input/output circuit.

During a read operation, the sense amplifier 18 senses data read from the memory cell array 11. The sense amplifier 18 transmits the read data to the data register 17. During a write operation, the sense amplifier 18 transmits write data to the memory cell array 11.

1.1.2 Configuration of RAM

Next, a configuration of the RAM 22 will be described with reference to FIG. 2.

Figure 2:
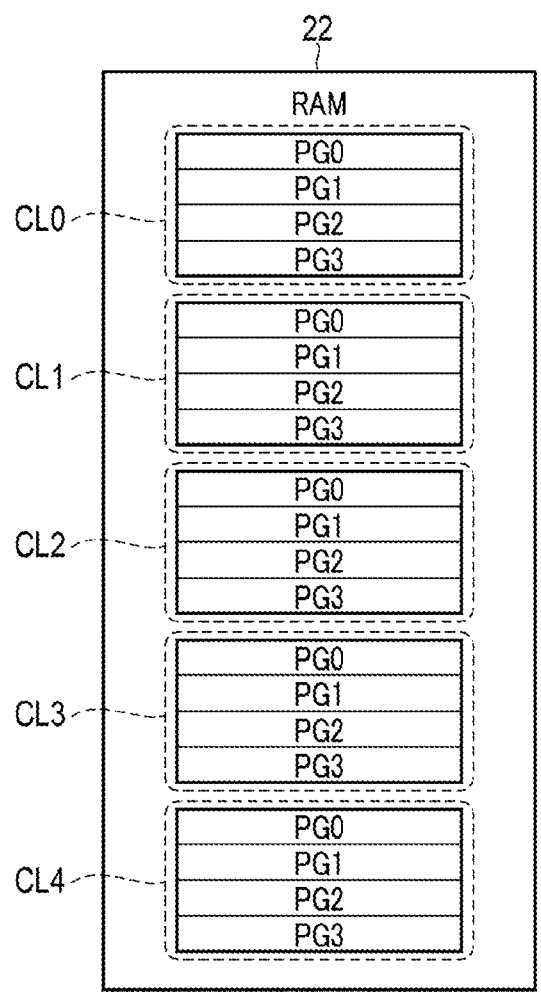
FIG. 2 is a block diagram of a RAM in the memory system according to the first embodiment.

As illustrated in FIG. 2, the RAM 22 includes page clusters CL0 to CL4. Each of the page clusters CL has regions PG0 to PG3. Each region PG can store data of one page. Definition of the "page" will be described later. In other words, each of the page clusters CL0 to CL4 can store data of four pages. A storage capacity of the page cluster CL is not limited to four pages, and may be two pages, three pages, or five or more pages.

1.1.3 Configuration of Memory Cell Array

Figure 3:
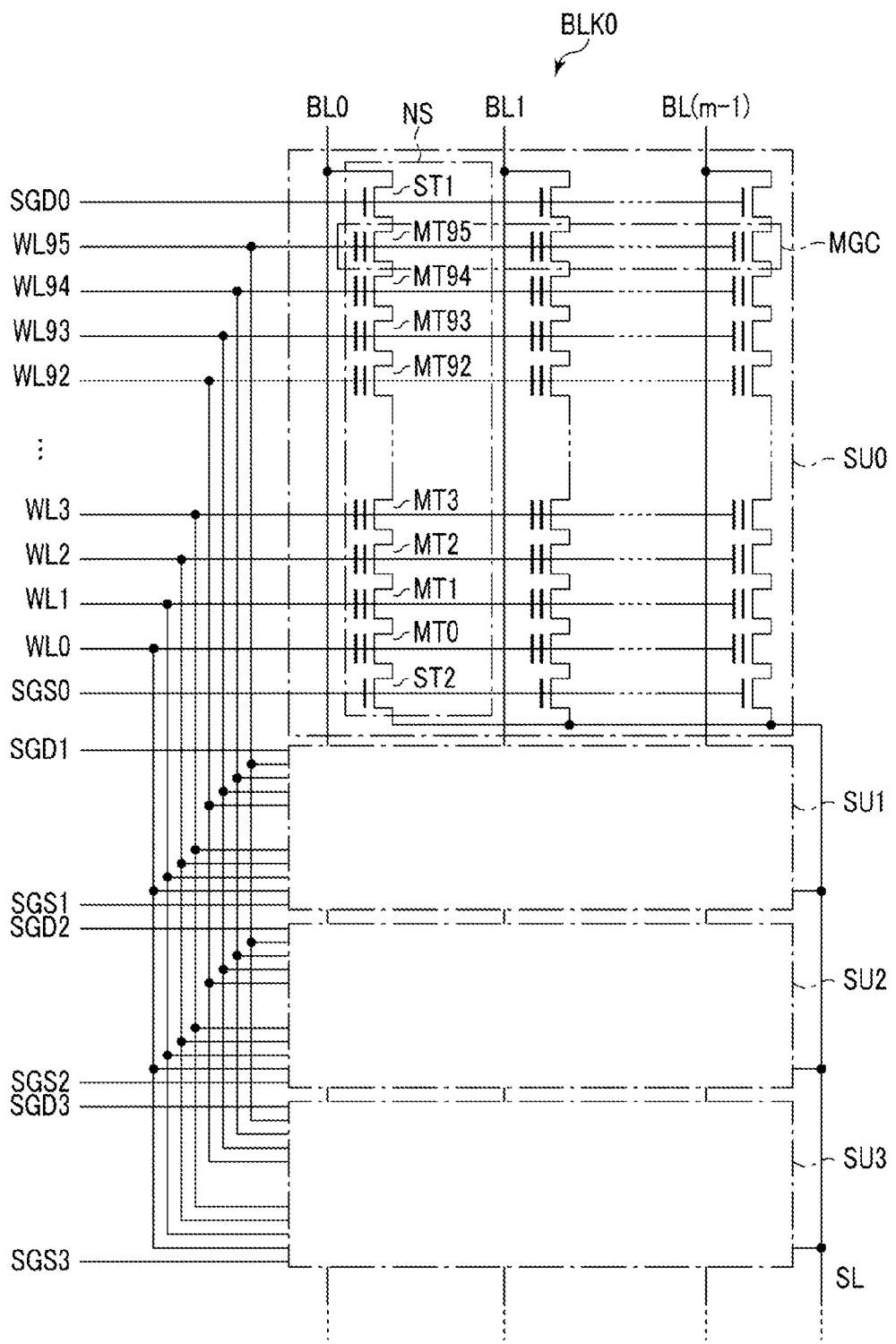
FIG. 3 is a circuit diagram of a memory cell array in a semiconductor storage device according to the first embodiment.

Next, a configuration of the memory cell array 11 will be described with reference to FIG. 3. FIG. 3 illustrates an example of the block BLK0, but other blocks BLK have the same configuration.

As illustrated in FIG. 3, the block BLK0 includes, for example, four string units SU (SU0 to SU3). Each string unit SU includes a plurality of NAND strings NS. Each of the NAND strings NS includes, for example, 96 memory cell transistors MT0 to MT95, and select transistors ST1 and ST2. Hereinafter, in a case where the memory cell transistors MT0 to MT95 are not differentiated from each other, the memory cell transistors will be referred to as a memory cell transistor MT. The memory cell transistor MT includes a control gate and a charge storage layer, and stores data in a nonvolatile manner.

The number of string units SU is not limited to four. The memory cell transistor MT may be of a MONOS type in which an insulating film is used for a charge storage layer, and may be of an FG type in which a conductive layer is used for a charge storage layer. Hereinafter, in the present embodiment, the MONOS type will be described as an example. The number of memory cell transistors MT is not limited to ninety-six, and may be eight, sixteen, thirty-two, sixty-four, or one hundred twenty-eight, and the number thereof is not limited. The number of select transistors ST1 and ST2 is any number, and the number of each thereof may be one or more.

The memory cell transistors MT are connected in series to each other between a source of the select transistor ST1 and a drain of the select transistor ST2. More specifically, current paths of the memory cell transistors MT0 to MT95 are connected in series to each other. A drain of the memory cell transistor MT95 is connected to the source of the select transistor ST1, and a source of the memory cell transistor MT0 is connected to the drain of the select transistor ST2.

In the respective string units SU0 to SU3, gates of the select transistors ST1 are respectively connected to select gate lines SGD0 to SGD3. Similarly, gates of the select transistors ST2 in the string units SU0 to SU3 are respectively connected to select gate lines SGS0 to SGS3. Hereinafter, in a case where the select gate lines SGD0 to SGD3 are not differentiated from each other, the select gate lines will be referred to as a select gate line SGD. In a case where the select gate lines SGS0 to SGS3 are not differentiated from each other, the select gate lines will be referred to as a select gate line SGS. The select gate lines SGS0 to SGS3 of the respective string units SU may be connected in common.

The control gates of the memory cell transistors MT0 to MT95 in the block BLK are respectively connected in common to word lines WL0 to WL95. Hereinafter, in a case where the word lines WL0 to WL95 are not differentiated from each other, the word lines will be referred to as a word line WL or WLi (where i is an integer of 0 to 95).

The drains of the select transistors ST1 of each NAND string NS in the string unit SU are connected to different bit lines BL0 to BL(m−1) (where m is an integer of 2 or greater). Hereinafter, in a case where the bit lines BL0 to BL(m−1) are not differentiated from each other, the bit lines will be referred to as a bit line BL. Each bit line BL connects the NAND strings NS of the string units SU to each other in a plurality of blocks BLK. The sources of the plurality of select transistors ST2 are connected to a source line SL. In other words, the string unit SU is an aggregate of the NAND strings NS which are connected to different bit lines BL and are connected to the same select gate lines SGD and SGS. The block BLK is an aggregate of a plurality of string units SU having the common word lines WL. The memory cell array 11 is an aggregate of a plurality of blocks BLK having the bit lines BL.

Writing and reading of data are collectively performed on the memory cell transistors MT connected to any word line WL in any string unit SU. Hereinafter, a group of the memory cell transistors MT which are collectively selected during a data write operation and read operation will be referred to as a "memory cell group MCG". In a single memory cell group MCG, a set of 1-bit data written into or read from each memory cell transistor MT will be referred to as a "page". Therefore, in a case where 4-bit data is stored in a single memory cell transistor MT, data of four pages is stored in the memory cell group MCG connected to a single word line WL.

In the present embodiment, a single memory cell transistor MT can hold 4-bit data. In other words, the memory cell transistor MT of the present embodiment is a quad-level cell (QLC) holding 4-bit data. 4-bit data held in the quad-level cell (QLC) memory cell transistor will be referred to as a lower bit, a middle bit, an upper bit, and a top bit in order from the lowest bit. A set of lower bits held in the memory cell transistors MT connected to the same word line WL will be referred to as a "lower page", a set of middle bits will be referred to as a "middle page", a set of upper bits will be referred to as an "upper page", and a set of top bits will be referred to as a "top page".

The number of bits of data which can be held in the memory cell transistor MT is not limited to four bits, and the process is applicable as long as the number of bits is a plurality of bits, that is, two or more bits. For example, the memory cell transistor MT is a multi-level cell (MLC) holding 2-bit data, and may be a three-level cell (TLC) holding 3-bit data.

Other configurations may be used as a configuration of the memory cell array 11, such as a configuration of the memory cell array 11 disclosed in U.S. patent application Ser. No. 12/407,403, filed on Mar. 19, 2009, entitled "three-dimensional stacked nonvolatile semiconductor memory," U.S. patent application Ser. No. 12/406,524, filed on Mar. 18, 2009, entitled "three-dimensional stacked nonvolatile semiconductor memory," U.S. patent application Ser. No. 12/679,991, filed on Mar. 25, 2010, entitled "nonvolatile semiconductor storage device and manufacturing the same," and U.S. patent application Ser. No. 12/532,030, filed on Mar. 23, 2009, entitled "semiconductor memory and manufacturing same." The entire contents of the above patent applications are incorporated by reference in the present application.

1.2 Threshold Voltage Distribution in Memory Cell Transistor MT

Figure 4:
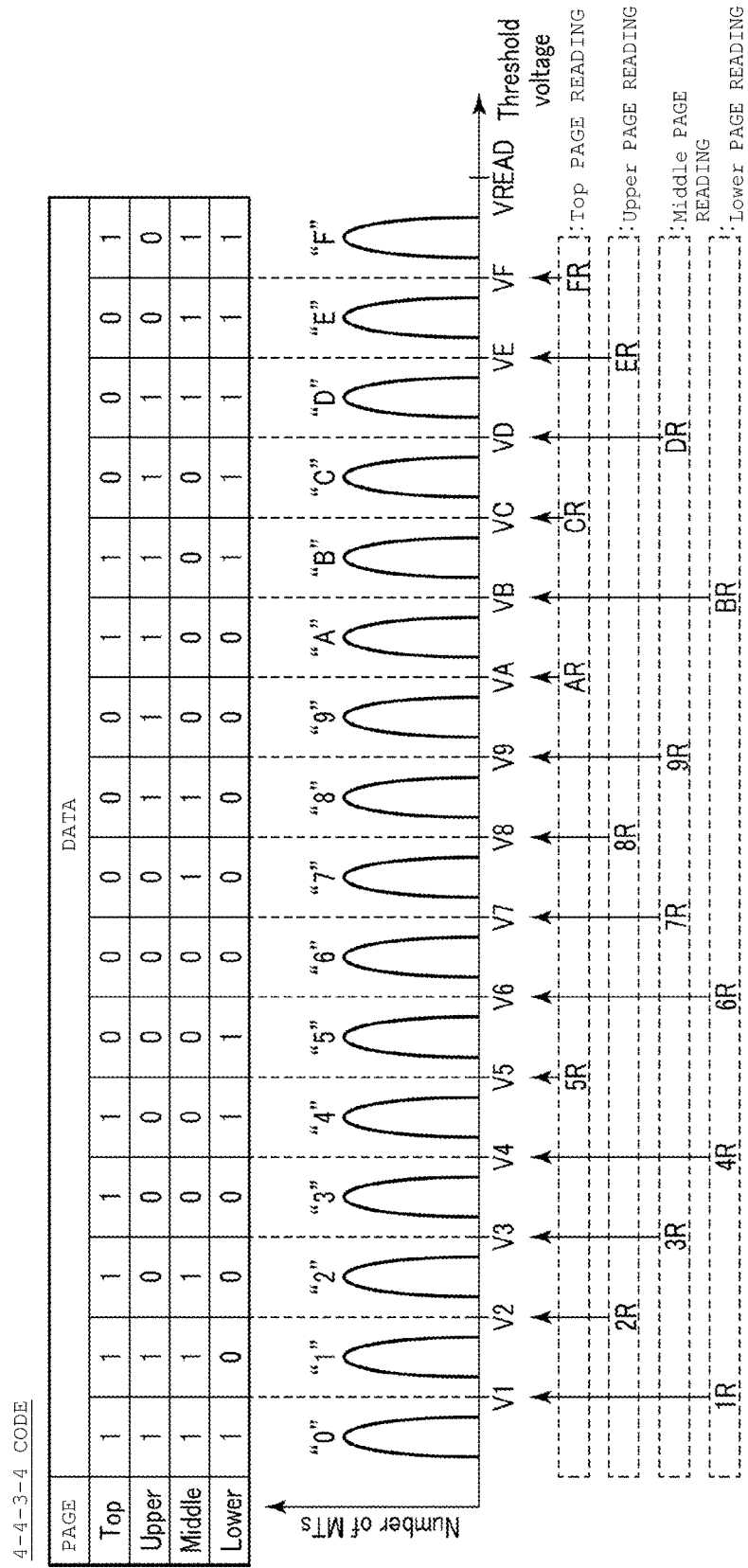
FIG. 4 is a diagram illustrating data allocation, a threshold voltage distribution, and a read level in a memory cell transistor of the semiconductor storage device according to the first embodiment.

Next, with reference to FIG. 4, a description will be made of a threshold voltage distribution in the memory cell transistor MT. FIG. 4 illustrates data which can be taken by each memory cell transistor MT, a threshold voltage distribution, and a voltage used during a read operation.

As illustrated in FIG. 4, in a case where the memory cell transistor MT holds 4-bit data, a threshold voltage distribution thereof is divided into sixteen distributions. The sixteen threshold voltage distributions will be referred to as a "0" level, a "1" level, a "2" level, a "3" level, a "4" level, a "5" level, a "6" level, a "7" level, an "8" level, a "9" level, an "A" level, a "B" level, a "C" level, a "D" level, an "E" level, and an "F" level in order from the lowest level.

Voltages V1, V2, V3, V4, V5, V6, V7, V8, V9, VA, VB, VC, VD, VE, and VF illustrated in FIG. 4 are used to respectively verify the "0" level, the "1" level, the "2" level, the "3" level, the "4" level, the "5" level, the "6" level, the "7" level, the "8" level, the "9" level, the "A" level, the "B" level, the "C" level, the "D" level, then "E" level, and the "F" level during a write operation. A voltage VREAD is a voltage applied to a non-selected word line during a read operation. If the voltage VREAD is applied to the gate of the memory cell transistor MT, the memory cell transistor MT is turned on regardless of data held therein. A relationship among the voltage values is $V1<V2<V3<V4<V5<V6<V7<V8<V9<VA<VB<VC<VD<VE<VF<VREAD$.

Among the threshold voltage distributions, the "0" level corresponds to an erased state of the memory cell transistor MT. A threshold voltage in the "0" level is lower than the voltage V1. A threshold voltage in the "1" level is equal to or higher than the voltage V1 and is lower than the voltage V2. A threshold voltage in the "2" level is equal to or higher than the voltage V2 and is lower than the voltage V3. A threshold voltage in the "3" level is equal to or higher than the voltage V3 and is lower than the voltage V4. A threshold voltage in the "4" level is equal to or higher than the voltage V4 and is lower than the voltage V5. A threshold voltage in the "5" level is equal to or higher than the voltage V5 and is lower than the voltage V6. A threshold voltage in the "6" level is equal to or higher than the voltage V6 and is lower than the voltage V7. A threshold voltage in the "7" level is equal to or higher than the voltage V7 and is lower than the voltage V8. A threshold voltage in the "8" level is equal to or higher than the voltage V8 and is lower than the voltage V9. A threshold voltage in the "9" level is equal to or higher than the voltage V9 and is lower than the voltage VA. A threshold voltage in the "A" level is equal to or higher than the voltage VA and is lower than the voltage VB. A threshold voltage in the "B" level is equal to or higher than the voltage VB and is lower than the voltage VC. A threshold voltage in the "C" level is equal to or higher than the voltage VC and is lower than the voltage VD. A threshold voltage in the "D" level is equal to or higher than the voltage VD and is lower than the voltage VE. A threshold voltage in the "E" level is equal to or higher than the voltage VE and is lower than the voltage VF. A threshold voltage in the "F" level is equal to or higher than the voltage VF and is lower than the voltage VREAD.

In this example, for simplification of description, in a read operation, a description has been made of a case where a verification voltage is used as a read voltage as an example. Hereinafter, read operations using the voltages V1, V2, V3, V4, V5, V6, V7, V8, V9, VA, VB, VC, VD, VE, and VF will be respectively referred to as read operations 1R, 2R, 3R, 4R, 5R, 6R, 7R, 8R, 9R, AR, BR, CR, DR, ER, and FR. In the read operation 1R, it is determined whether or not a threshold voltage of the memory cell transistor MT is lower than the voltage V1. In the read operation 2R, it is determined whether or not a threshold voltage of the memory cell transistor MT is lower than the voltage V2. In the read operation 3R, it is determined whether or not a threshold voltage of the memory cell transistor MT is lower than the voltage V3. The same applies thereafter.

The sixteen threshold voltage distributions are formed by writing 4-bit data including a lower bit, a middle bit, an upper bit, and a top bit. The sixteen threshold voltage distributions respectively correspond to different pieces of 4-bit data. In the present embodiment, data is allocated to "lower bit/middle bit/upper bit/top bit" so as to be expressed as follows with respect to the memory cell transistor MT included in each level.

The memory cell transistor MT included in the "0" level holds data of "1111". The memory cell transistor MT included in the "1" level holds data of "0111". The memory cell transistor MT included in the "2" level holds data of "0101". The memory cell transistor MT included in the "3" level holds data of "0001". The memory cell transistor MT included in the "4" level holds data of "1001". The memory cell transistor MT included in the "5" level holds data of "1000". The memory cell transistor MT included in the "6" level holds data of "0000". The memory cell transistor MT included in the "7" level holds data of "0100". The memory cell transistor MT included in the "8" level holds data of "0110". The memory cell transistor MT included in the "9" level holds data of "0010". The memory cell transistor MT included in the "A" level holds data of "0011". The memory cell transistor MT included in the "B" level holds data of "1011". The memory cell transistor MT included in the "C" level holds data of "1010". The memory cell transistor MT included in the "D" level holds data of "1110". The memory cell transistor MT included in the "E" level holds data of "1100". The memory cell transistor MT included in the "F" level holds data of "1101".

In a case where the data allocated as mentioned above is read, a lower bit is determined through the read operations 1R, 4R, 6R, and BR. A middle bit is determined through the read operations 3R, 7R, 9R, and DR. An upper bit is determined through the read operations 2R, 8R, and ER. A top bit is determined through the read operations 5R, AR, CR, and FR. In other words, the lower bit, the middle bit, the upper bit, and the top bit are respectively determined through four, four, three, and four read operations. Hereinafter, this data allocation will be referred to as a "4-4-3-4 code".

1.3 Write Operation

Next, a description will be made of a write operation. The write operation includes a program operation and a verification operation. A combination (hereinafter, referred to as a "program loop") of the program operation and the verification operation is repeated, and thus a threshold voltage of the memory cell transistor MT increases to a target level.

The program operation is an operation in which a threshold voltage is increased by injecting electrons into the charge storage layer, or a threshold voltage is maintained by prohibiting injection. Hereinafter, an operation of increasing a threshold voltage will be referred to as a ""0" program". For example, an operation of increasing a threshold voltage of the memory cell transistor MT included in the threshold voltage distribution of the "0" level so that it can be in the threshold voltage distribution of the "1" level is referred to as the "0" program. A voltage (for example, a voltage VSS) for the "0" program is applied to the bit line BL which is set as a "0" program target from the sense amplifier 18. On the other hand, an operation of maintaining a threshold voltage is referred to as a ""1" program" or "write prohibition", and a voltage (hereinafter, referred to as a "voltage VBL") for the "1" program is applied to the bit line BL which is set as a "1" program target from the sense amplifier 18. Hereinafter, a bit line corresponding to the "0" program is indicated by BL("0"), and a bit line corresponding to the "1" program is indicated by BL("1").

The verification operation is an operation of reading data after the program operation, and determining whether or not a threshold voltage of the memory cell transistor MT reaches a target level. Hereinafter, a case where a threshold voltage of the memory cell transistor MT reaches a target level is referred to as "verification being passed", and a case where the threshold voltage does not reach the target level is referred to as "verification failing".

1.3.1 First and Second Write Operations

Next, a write operation of the present embodiment will be described in detail. In the present embodiment, a write operation for 4-page data is performed to be divided into two operations such as a first write operation and a second write operation. Hereinafter, a write operation performed on a certain memory cell group MCG for the first time will be referred to as a "first write operation", and a write operation on the memory cell group MCG for the second time (or more generally, the n-th time) will be referred to as a "second write operation" (or the n-th write operation). Each of the first and second write operations is performed on the basis of write data of four pages. In the present embodiment, in the first write operation, 4-page data is coarsely written, and, in the second write operation, the 4-page data is finely written. A write operation may be divided into three or more operations. For example, 4-page data may be written three times or more, and may be written four times or more for each piece of page data.

Figure 5:
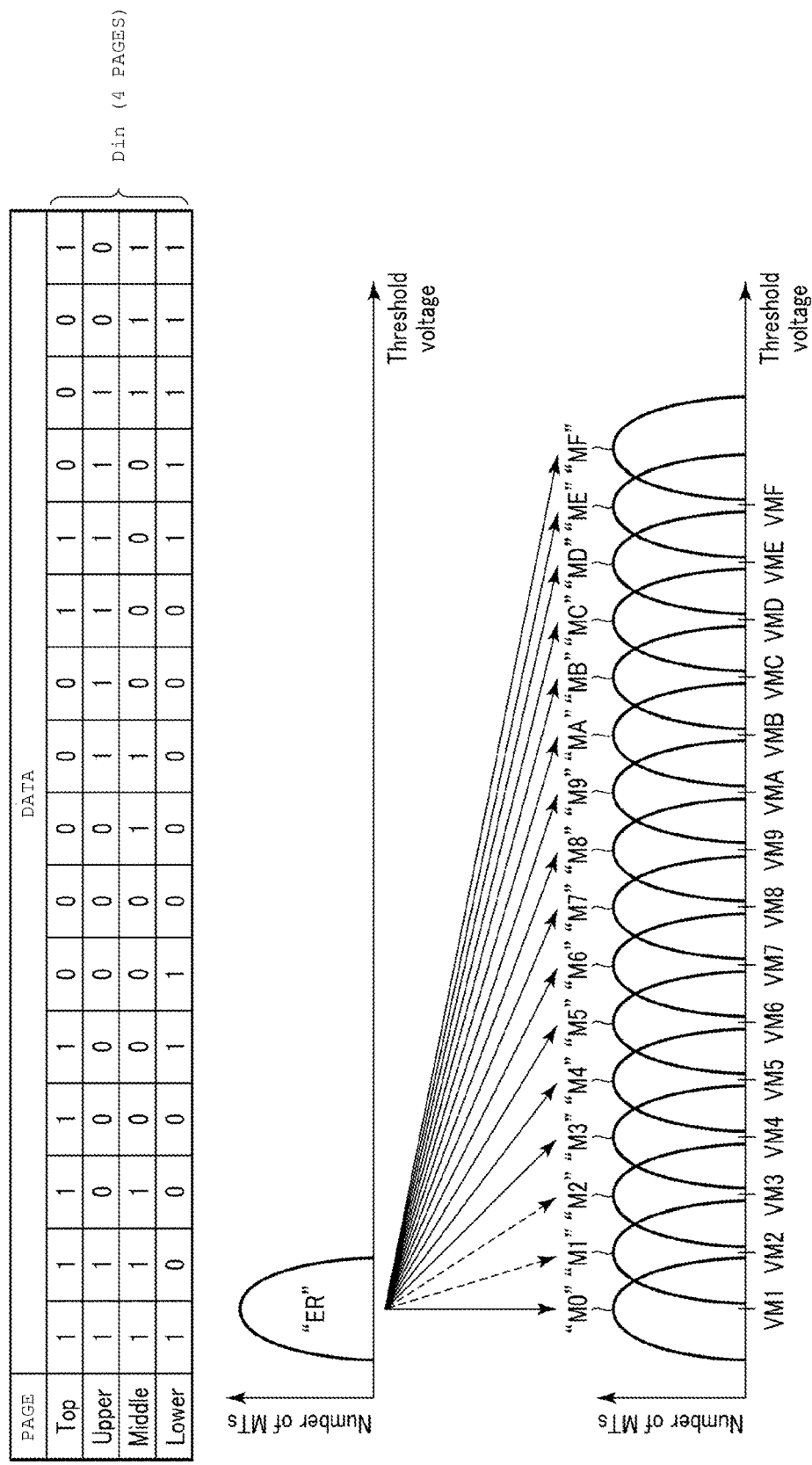
FIG. 5 is a diagram illustrating a change in a threshold voltage distribution in the memory cell transistor due to a first write operation in the semiconductor storage device according to the first embodiment.

First, with reference to FIG. 5, the first write operation will be described. FIG. 5 illustrates a change in a threshold voltage distribution in the memory cell transistor MT due to the first write operation.

As illustrated in FIG. 5, the sequencer 14 performs the first write operation on the basis of 4-page data which is input from the controller 20.

A threshold voltage of the memory cell transistor MT before the first write operation is performed is distributed in the "ER" level. A threshold voltage in the "ER" level is lower than the voltage V1, and corresponds to an erased state of the memory cell transistor MT.

In the first write operation, the sequencer 14 uses voltages VM1, VM2, VM3, VM4, VM5, VM6, VM7, VM8, VM9, VMA, VMB, VMC, VMD, VME, and VMF as verification voltages. The voltages VM1, VM2, VM3, VM4, VM5, VM6, VM7, VM8, VM9, VMA, VMB, VMC, VMD, VME, and VMF are respectively used to write data of "1111" ("lower bit/middle bit/upper bit/top bit"), data of "0111", data of "0101", data of "0001", data of "1001", data of "1000", data of "0000", data of "0100", data of "0110", data of "0010", data of "0011", data of "1011", data of "1010", data of "1110", data of "1100", and data of "1101". The voltage VM1 is lower than the voltage V1. The voltage VM2 is equal to or higher than the voltage V1 and is lower than the voltage V2. The voltage VM3 is equal to or higher than the voltage V2 and is lower than the voltage V3. The voltage VM4 is equal to or higher than the voltage V3 and is lower than the voltage V4. The voltage VM5 is equal to or higher than the voltage V4 and is lower than the voltage V5. The voltage VM6 is equal to or higher than the voltage V5 and is lower than the voltage V6. The voltage VM7 is equal to or higher than the voltage V6 and is lower than the voltage V7. The voltage VM8 is equal to or higher than the voltage V7 and is lower than the voltage V8. The voltage VM9 is equal to or higher than the voltage V8 and is lower than the voltage V9. The voltage VMA is equal to or higher than the voltage V9 and is lower than the voltage VA. The voltage VMB is equal to or higher than the voltage VA and is lower than the voltage VB. The voltage VMC is equal to or higher than the voltage VB and is lower than the voltage VC. The voltage VMD is equal to or higher than the voltage VC and is lower than the voltage VD. The voltage VME is equal to or higher than the voltage VD and is lower than the voltage VE. The voltage VMF is equal to or higher than the voltage VE and is lower than the voltage VF.

If the first write operation is performed, a threshold voltage of the memory cell transistor MT is increased on the basis of written data, and sixteen threshold voltage distributions are formed. In the first write operation, as illustrated in FIG. 5, in the sixteen threshold voltage distributions, adjacent threshold voltage distributions may overlap each other. An "M0" level illustrated in FIG. 5 is formed by a plurality of memory cell transistors MT into which the data of "1111" is written. An "M1" level is formed by a plurality of memory cell transistors MT into which the data of "0111" is written. An "M2" level is formed by a plurality of memory cell transistors MT into which the data of "0101" is written. The same applies thereafter.

A threshold voltage in the "M0" level is lower than the voltage V1, and corresponds to an erased state of the memory cell transistor MT in the same manner as in the "0" level and "ER" level. In other words, in the memory cell transistor MT into which the data of "1111" is written in the first write operation, an increase in a threshold voltage thereof is prevented. However, a threshold voltage in the "M0" level slightly increases due to the first write operation although a threshold level does not change to the "1" level. A threshold voltage in the "M1" level is equal to or higher than the voltage VM1 and is lower than the voltage V2. A threshold voltage in the "M2" level is equal to or higher than the voltage VM2 and is lower than the voltage V3. The same applies thereafter.

As mentioned above, the voltages VM1, VM2, VM3, VM4, VM5, VM6, VM7, VM8, VM9, VMA, VMB, VMC, VMD, VME, and VMF used for verification in the first write operation are set such that threshold voltages of the memory cell transistor MT passing the verification do not exceed the voltages V2, V3, V4, V5, V6, V7, V8, V9, VA, VB, VC, VD, VE, VF, and VREAD.

Figure 6:
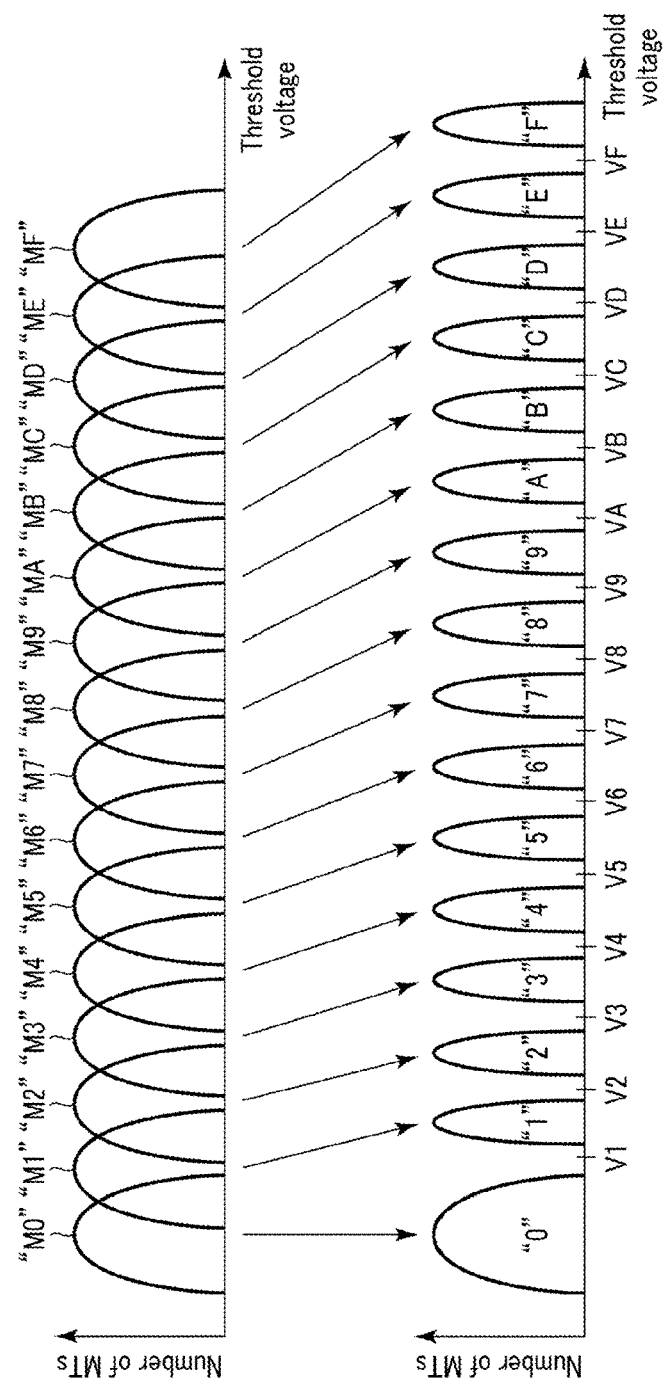
FIG. 6 is a diagram illustrating a change in a threshold voltage distribution in the memory cell transistor due to a second write operation in the semiconductor storage device according to the first embodiment.

Next, the second write operation will be described with reference to FIG. 6. FIG. 6 illustrates a change in a threshold voltage distribution of the memory cell transistor MT due to the second write operation.

As illustrated in FIG. 6, the sequencer 14 performs the second write operation on the basis of 4-page data which is input from the controller 20.

In the second write operation, the sequencer 14 uses voltages V1, V2, V3, V4, V5, V6, V7, V8, V9, VA, VB, VC, VD, VE, and VF as verification voltages. If the second write operation is performed, a threshold voltage of the memory cell transistor MT increases on the basis of written data, and sixteen narrow threshold voltage distributions are formed from sixteen wide threshold voltage distributions. For example, a threshold voltage distribution in the "0" level is formed from a threshold voltage distribution in the "M0" level, a threshold voltage distribution in the "1" level is formed from a threshold voltage distribution in the "M1" level, and a threshold voltage distribution in the "2" level is formed from a threshold voltage distribution in the "M2" level. The same applies thereafter.

1.3.2 Command Sequence

Figure 7:
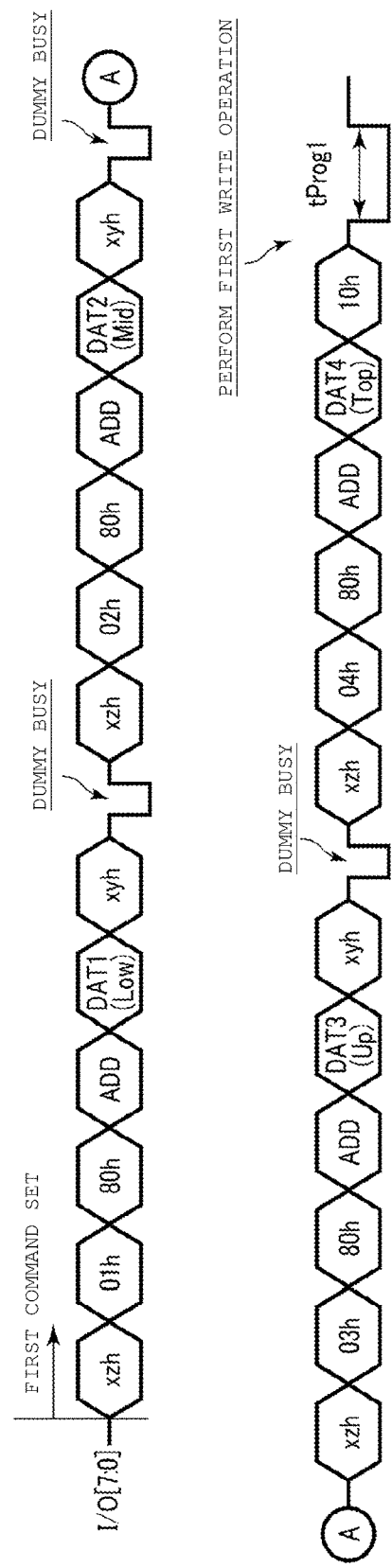
FIG. 7 is a diagram illustrating a command sequence of the first write operation in the memory system according to the first embodiment.
Figure 8:
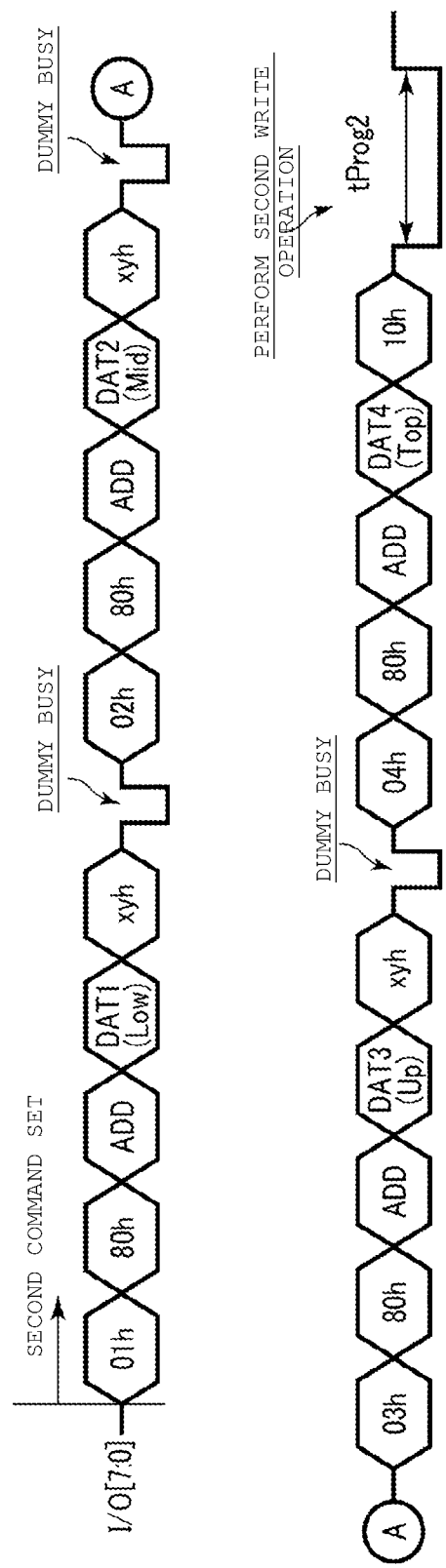
FIG. 8 is a diagram illustrating a command sequence of the second write operation in the memory system according to the first embodiment.

Next, a description will be made of a sequence of commands transmitted from the controller 20 to the semiconductor storage device with reference to FIGS. 7 and 8. FIGS. 7 and 8 illustrate command sequences in the first write operation and the second write operation, and illustrate the input/output signals I/O which are input to the semiconductor storage device 10. It is assumed that the command CMD which is input to the semiconductor storage device 10 is stored in the command register 12, the address information ADD is stored in the address register 13, and the data DAT is stored in a latch circuit (not illustrated) of the data register 17. In the following description, a combination of commands corresponding to the first write operation will be referred to as a first command set, and a combination of commands corresponding to the second write operation will be referred to as a second command set.

First, a command sequence in the first write operation will be described.

As illustrated in FIG. 7, first, the controller 20 transmits a command "xzh" to the semiconductor storage device 10. The command "xzh" is a command for instructing the semiconductor storage device 10 to perform the first write operation.

Next, the controller 20 issues and transmits a command "01h" to the semiconductor storage device 10. The command "01h" is a command indicating that the subsequently received data DAT is write data of a first page.

Next, the controller 20 issues and transmits a command "80h" to the semiconductor storage device 10. The command "80h" is a command for instructing the semiconductor storage device 10 to perform a write operation.

Next, the controller 20 subsequently transmits the address information ADD and data DAT1 of a lower page to the semiconductor storage device 10. The semiconductor storage device 10 stores the received data DAT1 in the latch circuit of the data register 17.

Next, the controller 20 issues and transmits a command "xyh" to the semiconductor storage device 10. If the command "xyh" is stored in the command register 12, the sequencer 14 sets the ready/busy signal RBn to a low ("L") level indicating a busy state, and transmits the data DAT1 held in the data register 17 to the sense amplifier 18. In a case where transmission of the data DAT1 to the sense amplifier 18 is completed, the sequencer 14 sets the ready/busy signal RBn to a high ("H") level indicating a ready state. This operation is indicated by "dummy busy" in FIG. 7.

Next, if the ready/busy signal RBn with an "H" level is received, the controller 20 sequentially transmits a command "xzh", a command "02h", a command "80h", the address information ADD, data DAT2 of a middle page, and the command "xyh" to the semiconductor storage device 10. The command "02h" is a command indicating that the subsequently received data DAT2 is write data of a second page. If the command "xyh" is stored in the command register 12, the sequencer 14 sets the ready/busy signal RBn to an "L" level, and transmits the data DAT2 held in the data register 17 to the sense amplifier 18.

Next, if the ready/busy signal RBn with an "H" level is received, the controller 20 sequentially transmits the command "xzh", a command "03h", the command "80h", the address information ADD, data DAT3 of an upper page, and the command "xyh" to the semiconductor storage device 10. If the command "xyh" is stored in the command register 12, the sequencer 14 sets the ready/busy signal RBn to an "L" level, and transmits the data DAT3 held in the data register 17 to the sense amplifier 18.

Next, if the ready/busy signal RBn with an "H" level is received, the controller 20 sequentially transmits the command "xzh", a command "04h", the command "80h", the address information ADD, data DAT4 of a top page, and a command "10h" to the semiconductor storage device 10.

If the command "10h" is stored in the command register 12, the sequencer 14 sets the ready/busy signal RBn to an "L" level, and transmits the data DAT4 held in the data register 17 to the sense amplifier 18. The sequencer 14 performs the first write operation on the basis of the data DAT1 to DAT4 stored in the sense amplifier 18. Thereafter, a period in which the first write operation is performed is indicated by tProg1.

Next, a description will be made of a command sequence in the second write operation.

As illustrated in FIG. 8, a command sequence in the second write operation is the same as the command sequence in the first write operation described with reference to FIG. 7 except for the command "xzh" which is initially applied in the first write operation.

If a last command "10h" illustrated in FIG. 8 is stored in the command register 12, the sequencer 14 sets the ready/busy signal RBn to an "L" level, and performs the second write operation. Thereafter, a period in which the second write operation is performed is indicated by tProg2.

1.3.3 Flow of Entire Write Operation

Figure 9:
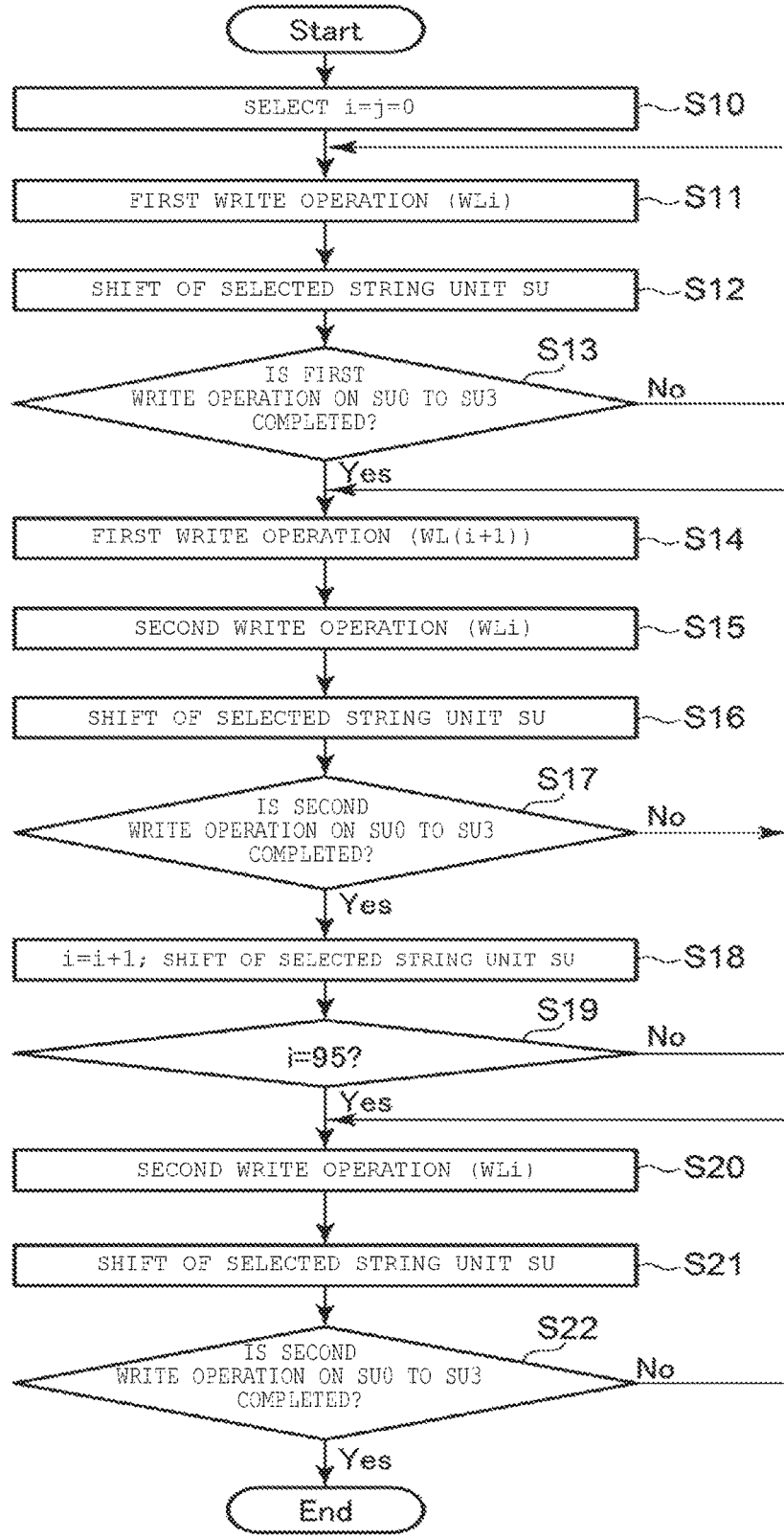
FIG. 9 depicts a flowchart illustrating a write operation in the semiconductor storage device according to the first embodiment.
Figure 10:
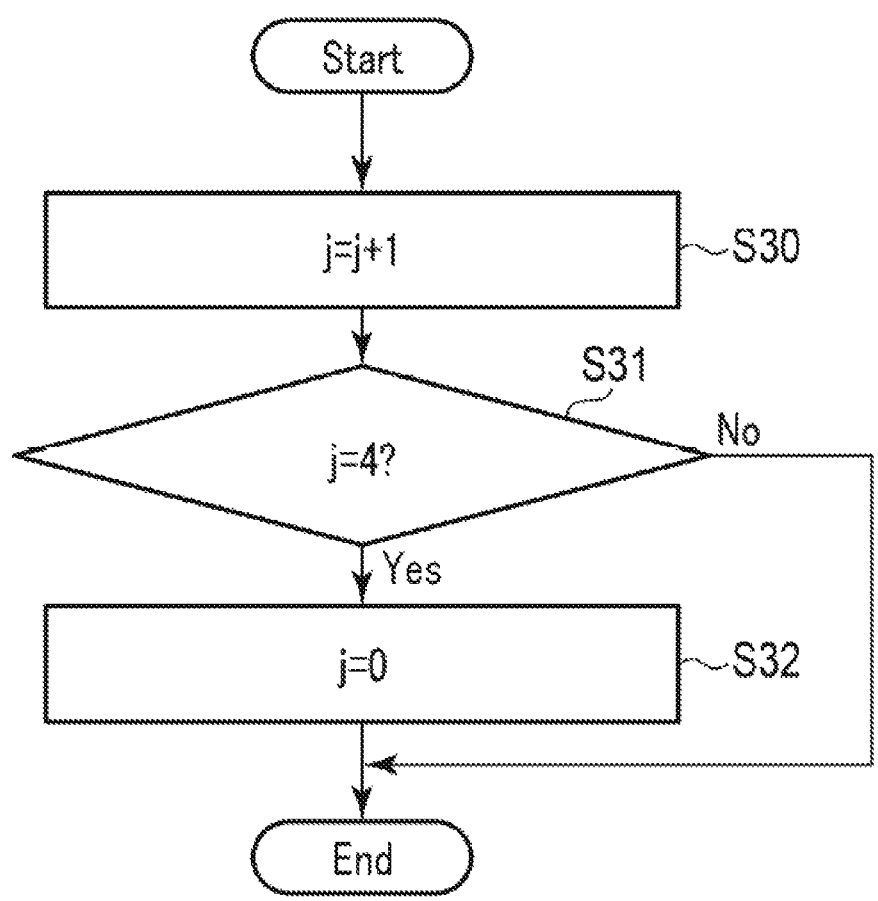
FIG. 10 depicts a flowchart illustrating a selected-string-unit shift operation in the write operation in the semiconductor storage device according to the first embodiment.

Next, a description will be made of a flow of the entire write operation with reference to FIGS. 9 and 10. FIG. 9 depicts a flowchart illustrating a write operation, and FIG. 10 depicts a flowchart illustrating a selected-string-unit shift operation in the write operation. In the following description, for simplification of the description, a variable i is used for the number of the word line WL, and a variable j is used for the number of the string unit SU. The variables i and j are, for example, variables stored in a counter of the controller 20, and are incremented under the control of the controller 20.

The sequencer 14 performs a write operation on the basis of the address information ADD and the data DAT transmitted from the controller 20.

As illustrated in FIG. 9, first, the controller 20 selects i=j=0, that is, the word line WL0 and the string unit SU0 (step S10), and transmits a first command set to the sequencer 14.

Next, the sequencer 14 performs the first write operation on the basis of the commands from the controller 20 (step S11).

Next, the controller 20 shifts the selected string unit SU (step S12).

More specifically, the controller 20 increments the variable j to j=j+1 in a case where j is 0, 1, or 2, and sets the variable j to j=0 in a case where j is 3. Then, the controller 20 checks whether or not the first write operation on the memory cell group MCG of the all string units SU0 to SU3 connected to the word line WLi (i=0) is completed (step S13).

In a case where the first write operation corresponding to the word line WLi is not completed in the all string units SU0 to SU3 (No in step S13), that is, in a case where the variable j after being shifted is 1, 2 or 3, the controller 20 transmits the first command set corresponding to the word line WLi to the sequencer 14. The flow returns to step S11, and the sequencer 14 performs the first write operation corresponding to the word line WLi.

On the other hand, in a case where the first write operation corresponding to the word line WLi is completed in the all string units SU0 to SU3 (Yes in step S13), that is, in a case where the variable j after being shifted is 0, the controller 20 transmits the first command set corresponding to the variable i=i+1, that is, the word line WL(i+1) to the sequencer 14.

Next, the sequencer 14 performs the first write operation corresponding to the word line WL(i+1) on the basis of the commands from the controller 20 (step S14).

After the first write operation is completed, the controller 20 transmits a second command set corresponding to the variable i, that is, the word line WLi to the sequencer 14. The sequencer 14 performs the second write operation corresponding to the word line WLi on the basis of the commands from the controller 20 (step S15).

Next, similarly to step S12, the controller 20 shifts the variable j, that is, the selected string unit SU (step S16). Then, the controller 20 checks whether or not the second write operation on the memory cell group MCG of the all string units SU0 to SU3 connected to the word line WLi is completed (step S17).

In a case where the second write operation corresponding to the word line WLi is not completed in the all string units SU0 to SU3 (No in step S17), the controller 20 transmits the first command set corresponding to the word line WL(i+1) to the sequencer 14. The flow returns to step S14, and the sequencer 14 performs the first write operation corresponding to the word line WL(i+1).

In a case where the second write operation corresponding to the word line WLi is completed in the all string units SU0 to SU3 (Yes in step S17), the controller increments the variable i to i=i+1. In addition, similarly to step S12, the controller 20 shifts the variable j, that is, the selection-string-unit SU (step S18).

Next, the controller 20 checks whether or not the variable i of the word line WLi is i=95 (step S19). In other words, the controller 20 checks whether or not the word line WLi is the word line WL95 of the terminal end.

In a case where i is not 95 (No in step S19), the controller 20 transmits the first command set corresponding to the word line WL(i+1) to the sequencer 14. The flow returns to step S14, and the sequencer 14 performs the first write operation corresponding to the word line WL(i+1).

In a case where i is 95 (Yes in step S19), the controller 20 transmits the second command set corresponding to the word line WLi to the sequencer 14. The sequencer 14 performs the second write operation corresponding to the word line WLi on the basis of the commands from the controller 20 (step S20).

Next, similarly to step S12, the controller 20 shifts the variable j, that is, the selected string unit SU (step S21).

Next, the controller 20 checks whether or not the second write operation on the memory cell group MCG connected to the word line WLi is completed in the all string units SU0 to SU3 (step S22).

In a case where the second write operation corresponding to the word line WLi is not completed in the all string units SU0 to SU3 (No in step S22), the controller 20 transmits the second command set corresponding to the word line WLi to the sequencer 14. The flow returns to step S20, and the sequencer 14 performs the second write operation corresponding to the word line WLi.

In a case where the second write operation corresponding to the word line WLi is completed in the all string units SU0 to SU3 (Yes in step S22), the controller 20 finishes the write operation in the block BLK.

Next, a description will be made of a selected-string-unit shift operation.

As illustrated in FIG. 10, first, the controller 20 increments the variable j to j=j+1 (step S30).

Next, in a case where j is 4 (Yes in step S31), the controller sets the variable j to J=0 (step S32). On the other hand, in a case where j is not 4 (NO in step S31), the controller leaves the variable unchanged from j=j+1 as being obtained at step S30.

1.3.4 Data Writing Order

Figure 11:
FIG. 11 is a diagram illustrating an order of writing data into a block of the semiconductor storage device according to the first embodiment.

Next, a description will be made of a data writing order with reference to FIG. 11. FIG. 11 illustrates an order of selecting the string unit SU in a single block BLK. A solid line rectangular frame which corresponds to the word line WL and the string unit SU and is partitioned into two parts such as an upper part and a lower part by a dashed line indicates a single memory cell group MCG, the upper part of the rectangular frame indicates the second write operation (reference sign "WRT2"), and the lower part of the rectangular frame indicates the first write operation (reference sign "WRT1").

As illustrated in FIG. 11, first, as first to fourth operations, the sequencer 14 performs the first write operation of selecting the word line WL0, and sequentially selecting the string units SU0 to SU3.

Next, as fifth and sixth operations, the sequencer 14 performs the first write operation of selecting the string unit SU0, and selecting the word line WL1, and the second write operation of selecting the word line WL0. As seventh to twelfth operations, the sequencer 14 sequentially selects the string units SU1 to SU3, and alternately performs the first write operation of selecting the word line WL1 and the second write operation of selecting the word line WL0 in the same process as in the fifth and sixth operations.

As thirteenth to twentieth operations, the sequencer 14 alternately performs the first write operation of selecting the word line WL2 for each string unit SU and the second write operation of selecting the word line WL1 in the same manner as in the fifth to twelfth operations. In the thirteenth to twentieth operations, the string units SU1, SU2, SU3, and SU0 are selected in this order. In other words, the string unit SU which is initially selected is shifted from SU0 to SU1.

Next, the sequencer 14 performs twenty-first to twenty-eighth operations of selecting the word lines WL3 and WL2 in the same manner as in the fifth to twelfth operations. In the twenty-first to twenty-eighth operations, the string units SU2, SU3, SU0, and SU1 are selected in this order. In other words, the string unit SU which is initially selected is shifted from SU1 to SU2.

Next, the sequencer 14 performs twenty-ninth to thirty-sixth operations of selecting the word lines WL4 and WL3 in the same manner as in the fifth to twelfth operations. In the twenty-ninth to thirty-sixth operations, the string units SU3, SU0, SU1, and SU2 are selected in this order. In other words, the string unit SU which is initially selected is shifted from SU2 to SU3.

Similarly, the sequencer 14 initially selects the string unit SU0 in thirty-seventh to forty-fourth operations of selecting the word lines WL5 and WL4, initially selects the string unit SU1 in forty-fifth to fifty-second operations of selecting the word lines WL6 and WL5, and initially selects the string unit SU2 in fifty-third to sixtieth operations of selecting the word lines WL7 and WL6. The same applies to the subsequent processes.

As described above, the sequencer 14 performs the write operation on the basis of the address information ADD and the data DAT transmitted from the controller 20.

In other words, when the sequencer 14 is caused to perform the write operation, the controller 20 designates the page address PA such that the string unit SU on which the second write operation is initially performed is repeatedly shifted in an order of the string units SU0, SU1, SU2, and SU3 from the word line WL0 to the word line WL95. In other words, when the sequencer 14 is caused to perform the write operation, the controller 20 designates the page address PA such that the string unit SU on which the first write operation is initially performed is repeatedly shifted in an order of the string units SU0, SU1, SU2, and SU3 from the word line WL1 to the word line WL95.

Therefore, a cycle of the string units SU to be selected every four word lines WL is repeated. Hereinafter, a group of the four word lines WL corresponding to the cycle is referred to as a word line group WG. In the example illustrated in FIG. 11, when focusing on an order of the string unit SU on which the second write operation is initially performed, four word lines WL0 to WL3 are set as a word line group WG0, and four word lines WL4 to WL7 are set as a word line group WG1. The same applies to the subsequent word lines WL.

Next, with reference to FIG. 12, a description will be made of an order of the second write operation in a single word line group WG.

Figure 12:
FIG. 12 is a diagram illustrating an order of the second write operation for a word line group of the semiconductor storage device according to the first embodiment.

As illustrated in FIG. 12, a certain word line group WG includes word lines WLi to WL(i+3). In a case of the word line WLi, the second write operation is performed on the string units SU0, SU1, SU2, and SU3 in this order. In a case of the word line WL(i+1), the initial string unit SU is shifted from the string unit SU0 to the string unit SU1, and the second write operation is performed on the string units SU1, SU2, SU3, and SU0 in this order. In a case of the word line WL(i+2), the initial string unit SU is shifted from the string unit SU1 to the string unit SU2, and the second write operation is performed on the string units SU2, SU3, SU0, and SU1 in this order. In a case of the word line WL(i+3), the initial string unit SU is shifted from the string unit SU2 to the string unit SU3, and the second write operation is performed on the string units SU3, SU0, SU1, and SU2 in this order.

1.3.5 Voltage of Each Line During Program Operation

Figure 13:
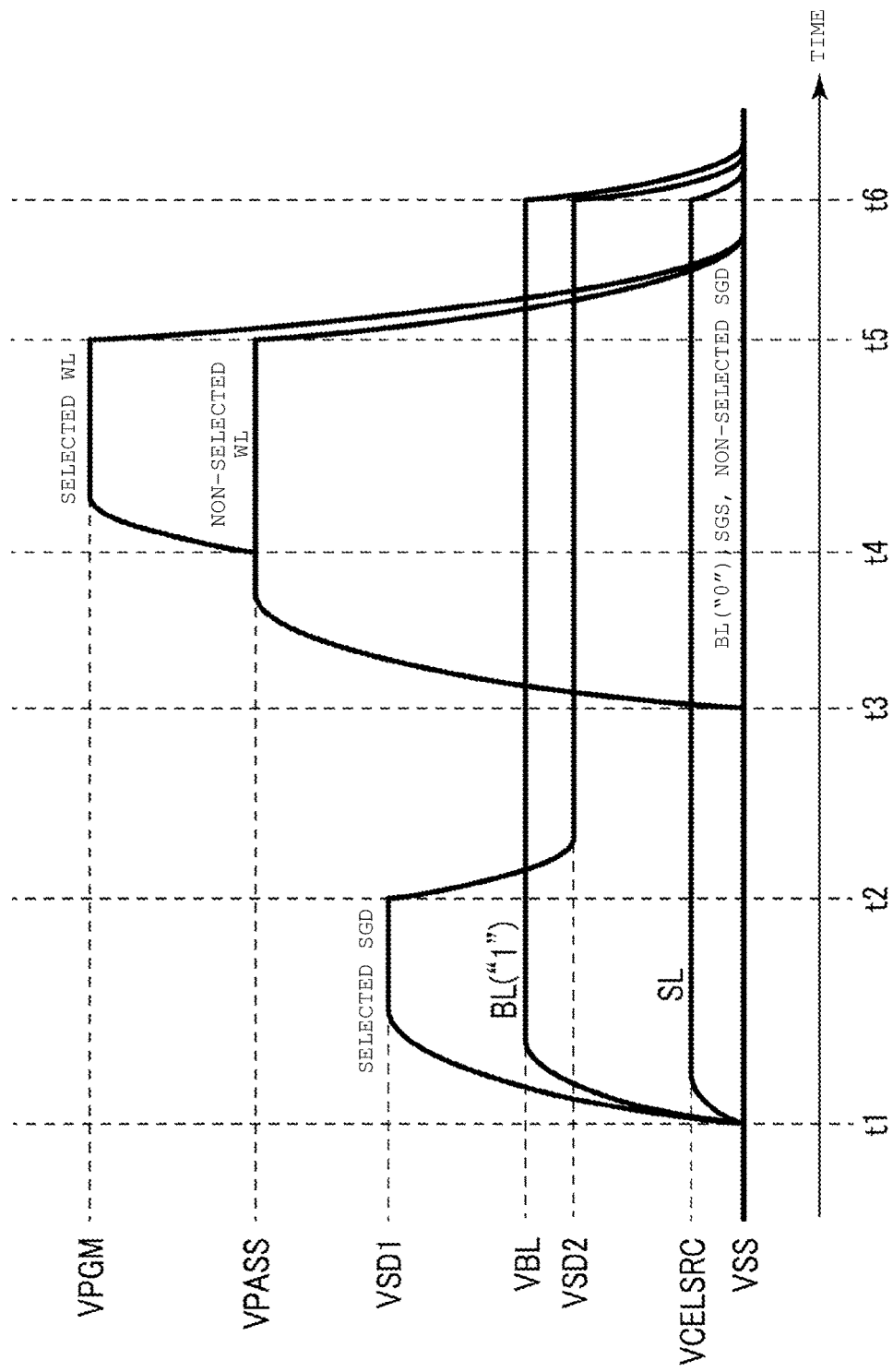
FIG. 13 is a timing chart illustrating a voltage of each line during a program operation in the semiconductor storage device according to the first embodiment.
Figure 14:
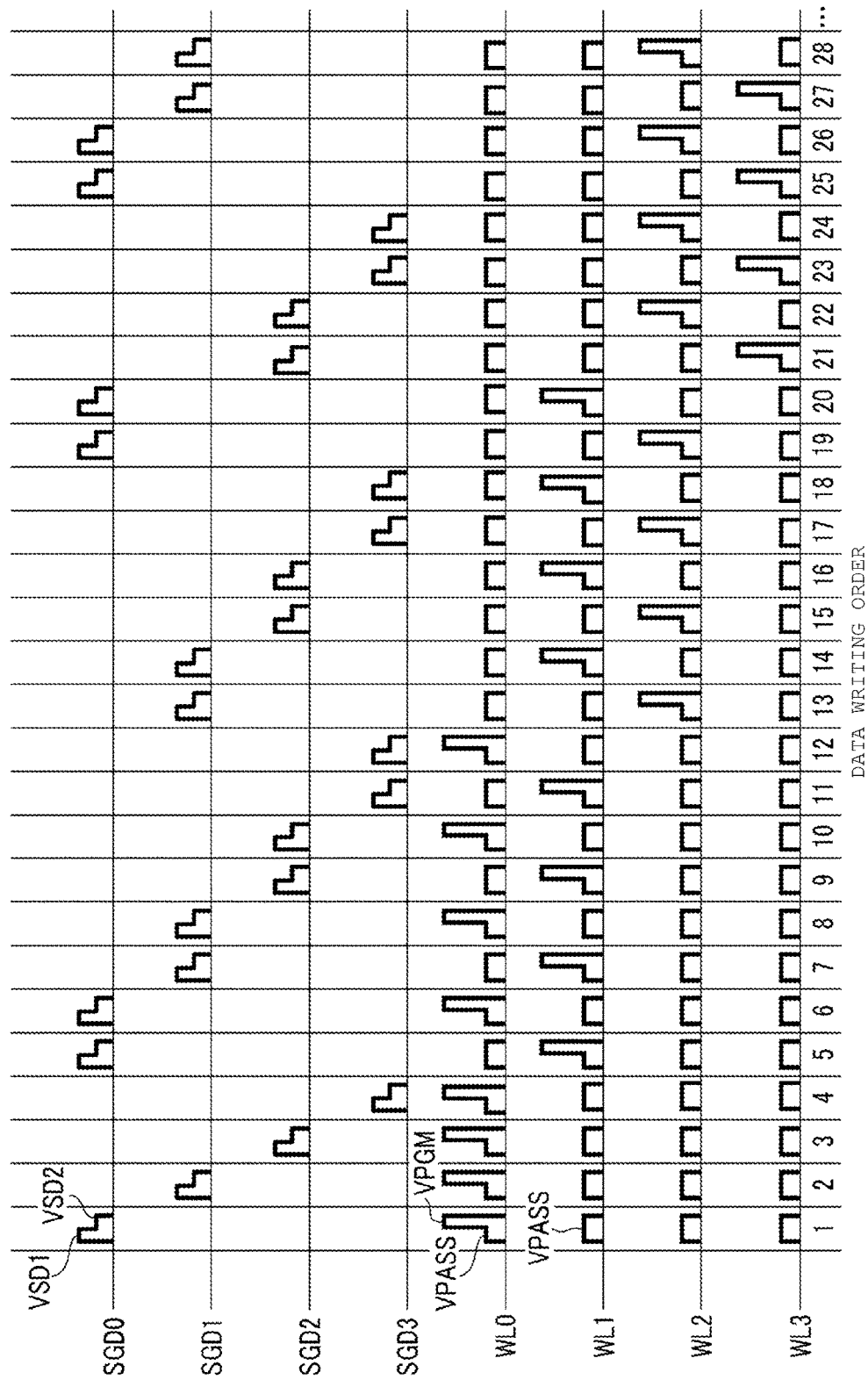
FIG. 14 is a diagram illustrating voltages of select gate lines and word lines during a program operation in first to twenty-eighth operations in the semiconductor storage device according to the first embodiment.

Next, a description will be made of an example of a voltage of each line during a program operation with reference to FIGS. 13 and 14. The example illustrated in FIG. 13 shows a program operation in a first program loop. The example illustrated in FIG. 14 shows a data writing order (first to twenty-eighth operations) and voltages of the select gate lines SGD0 to SGD3 and the word lines WL0 to WL4 corresponding thereto. For simplification of the description, the example illustrated in FIG. 14 shows a first program operation of each write operation.

As illustrated in FIG. 13, at a time point t1, the sense amplifier 18 applies the voltage VBL to the bit line BL("1") so as to start BL precharge. The row decoder 16 applies a voltage VSD1 to the select gate line SGD (reference sign "selected SGD") of the selected string unit SU in the selected block BLK. The voltage VSD1 is a voltage for turning on the select transistor ST1. On the other hand, the row decoder 16 applies the voltage VSS to the select gate line SGD (reference sign "non-selected SGD") of the non-selected string unit SU, so as to turn off the corresponding select transistor ST1. The row decoder 16 applies the voltage VSS to the select gate lines SGS of the selected string unit SU and the non-selected string unit SU, so as to turn off the select transistors ST2. A voltage VCELSRC (>VSS) is applied to the source line SL.

At a time point t2, the row decoder 16 applies a voltage VSD2 to the select gate line SGD of the selected string unit SU. The voltage VSD2 is lower than the voltage VSD1 and the voltage VBL, and is a voltage for turning on the select transistor ST1 to which the voltage VSS is applied but turning off the select transistor ST1 to which the voltage VBL is applied. Consequently, channels of the NAND string NS corresponding to the bit line BL("1") are brought into a floating state.

At a time point t3, the row decoder 16 applies a voltage VPASS to each word line WL of the selected string unit SU.

The voltage VPASS is a voltage for turning on the memory cell transistor MT regardless of a threshold voltage of the memory cell transistor MT.

At a time point t4, the row decoder 16 applies a voltage VPGM to the selected word line WL of the selected string unit SU. The voltage VPGM is a voltage for injecting electrons into the charge storage layer.

Since the select transistor ST1 is in an ON state in the NAND string NS corresponding to the bit line BL("0"), a channel potential of the memory cell transistor MT connected to the selected word line WL is VSS. Therefore, a potential difference (VPGM-VSS) between the control gate and the channel increases. As a result, electrons are injected into the charge storage layer, and thus a threshold voltage of the memory cell transistor MT corresponding to the bit line BL("0") increases.

Since the select transistor ST1 is in an OFF state in the NAND string NS corresponding to the bit line BL("1"), a channel of the memory cell transistor MT connected to the selected word line WL electrically floats. Then, a channel potential increases due to capacitive coupling with the word line WL. Therefore, a potential difference between the control gate and the channel is smaller than that of the memory cell transistor MT corresponding to the bit line BL("0"). As a result, electrons are not injected (or in negligible amounts, if any) into the charge storage layer, and thus a threshold voltage of the memory cell transistor MT corresponding to the bit line BL("1") is maintained (the threshold voltage does not change to the degree to which a threshold voltage distribution level transitions to a higher distribution level).

At a time point t5, the row decoder 16 applies the voltage VSS to the word line WL.

At a time point t6, a recovery process is performed, and the program operation is finished.

Next, a description will be made of a data writing order and voltages of the select gate lines SGD0 to SGD3 and the word lines WL0 to WL4 corresponding thereto.

As illustrated in FIG. 14, first, the select gate line SGD0 and the word line WL0 are selected during a program operation in the first operation. The voltage VSD (voltages VSD1 and VSD2) is applied to the select gate line SGD0, the voltage VPGM (and the voltage VPASS) are applied to the selected word line WL0, and the voltage VPASS is applied to the non-selected word lines WL1 to WL3.

Similarly, in the second to fourth operations, the word line WL0 is selected, and the select gate lines SGD1 to SGD3 are also selected in this order. More specifically, the voltage VSD is applied to the select gate line SGD1 in the second operation, the voltage VSD is applied to the select gate line SGD2 in the third operation, and the voltage VSD is applied to the select gate line SGD3 in the fourth operation. In the second to fourth operations, the voltage VPGM is applied to the selected word line WL0, and the voltage VPASS is applied to the non-selected word lines WL1 to WL3.

Next, in the fifth and sixth operations, the select gate line SGD0 is selected, and the word lines WL1 and WL0 are selected in this order. More specifically, in the fifth operation, the voltage VSD is applied to the select gate line SGD0, the voltage VPGM is applied to the selected word line WL1, and the voltage VPASS is applied to the non-selected word lines WL0, WL2, and WL3. In the sixth operation, the voltage VSD is applied to the select gate line SGD0, the voltage VPGM is applied to the selected word line WL0, and the voltage VPASS is applied to the non-selected word lines WL1 to WL3.

Next, in the seventh to twelfth operations, the select gate lines SGD1 to SGD3 are selected in this order in the same procedure as in the fifth and sixth write operations. More specifically, in the seventh operation, the voltage VSD is applied to the select gate line SGD1, the voltage VPGM is applied to the selected word line WL1, and the voltage VPASS is applied to the non-selected word lines WL0, WL2, and WL3. In the eighth operation, the voltage VSD is applied to the select gate line SGD1, the voltage VPGM is applied to the selected word line WL0, and the voltage VPASS is applied to the non-selected word lines WL1 to WL3. In the ninth operation, the voltage VSD is applied to the select gate line SGD2, the voltage VPGM is applied to the selected word line WL1, and the voltage VPASS is applied to the non-selected word lines WL0, WL2, and WL3. In the tenth operation, the voltage VSD is applied to the select gate line SGD2, the voltage VPGM is applied to the selected word line WL0, and the voltage VPASS is applied to the non-selected word lines WL1 to WL3. In the eleventh operation, the voltage VSD is applied to the select gate line SGD3, the voltage VPGM is applied to the selected word line WL1, and the voltage VPASS is applied to the non-selected word lines WL0, WL2, and WL3. In the twelfth operation, the voltage VSD is applied to the select gate line SGD3, the voltage VPGM is applied to the selected word line WL0, and the voltage VPASS is applied to the non-selected word lines WL1 to WL3.

In the thirteenth to twentieth operations, the select gate line SGD1 is selected in the thirteenth and fourteenth operations, the select gate line SGD2 is selected in the fifteenth and sixteenth operations, the select gate line SGD3 is selected in the seventeenth and eighteenth operations, and the select gate line SGD0 is selected in the nineteenth and twentieth operations. The word line WL2 is selected in the thirteenth, fifteenth, seventeenth, and nineteenth operations, and the word line WL1 is selected in the fourteenth, sixteenth, eighteenth, and twentieth operations. More specifically, in the thirteenth operation, the voltage VSD is applied to the select gate line SGD1, the voltage VPGM is applied to the selected word line WL2, and the voltage VPASS is applied to the non-selected word lines WL0, WL1, and WL3. In the fourteenth operation, the voltage VSD is applied to the select gate line SGD1, the voltage VPGM is applied to the selected word line WL1, and the voltage VPASS is applied to the non-selected word lines WL0, WL2, and WL3. In the fifteenth operation, the voltage VSD is applied to the select gate line SGD2, the voltage VPGM is applied to the selected word line WL2, and the voltage VPASS is applied to the non-selected word lines WL0, WL1, and WL3. In the sixteenth operation, the voltage VSD is applied to the select gate line SGD2, the voltage VPGM is applied to the selected word line WL1, and the voltage VPASS is applied to the non-selected word lines WL0, WL2, and WL3. In the seventeenth operation, the voltage VSD is applied to the select gate line SGD3, the voltage VPGM is applied to the selected word line WL2, and the voltage VPASS is applied to the non-selected word lines WL0, WL1, and WL3. In the eighteenth operation, the voltage VSD is applied to the select gate line SGD3, the voltage VPGM is applied to the selected word line WL1, and the voltage VPASS is applied to the non-selected word lines WL0, WL2, and WL3. In the nineteenth operation, the voltage VSD is applied to the select gate line SGD0, the voltage VPGM is applied to the selected word line WL2, and the voltage VPASS is applied to the non-selected word lines WL0, WL1, and WL3. In the twentieth operation, the voltage VSD is applied to the select gate line SGD0, the voltage VPGM is applied to the selected word line WL1, and the voltage VPASS is applied to the non-selected word lines WL0, WL2, and WL3.

In the twenty-first to twenty-eighth operations, the select gate line SGD2 is selected in the twenty-first and twenty-second operations, the select gate line SGD3 is selected in the twenty-third and twenty-fourth operations, the select gate line SGD0 is selected in the twenty-fifth and twenty-sixth operations, and the select gate line SGD1 is selected in the twenty-seventh and twenty-eighth operations. The word line WL3 is selected in the twenty-first, twenty-third, twenty-fifth, and twenty-seventh operations, and the word line WL2 is selected in the twenty-second, twenty-fourth, twenty-sixth, and twenty-eighth operations. More specifically, in the twenty-first operation, the voltage VSD is applied to the select gate line SGD2, the voltage VPGM is applied to the selected word line WL3, and the voltage VPASS is applied to the non-selected word lines WL0 to WL2. In the twenty-second operation, the voltage VSD is applied to the select gate line SGD2, the voltage VPGM is applied to the selected word line WL2, and the voltage VPASS is applied to the non-selected word lines WL0, WL1, and WL3. Subsequently, according to the same procedure, the voltage VSD is applied to the selected select gate line SGD, the voltage VPGM is applied to the selected word line WL, and the voltage VPASS is applied to the non-selected word lines WL.

1.3.6 Voltage of Selected Word Line in First and Second Write Operations

Figure 15:
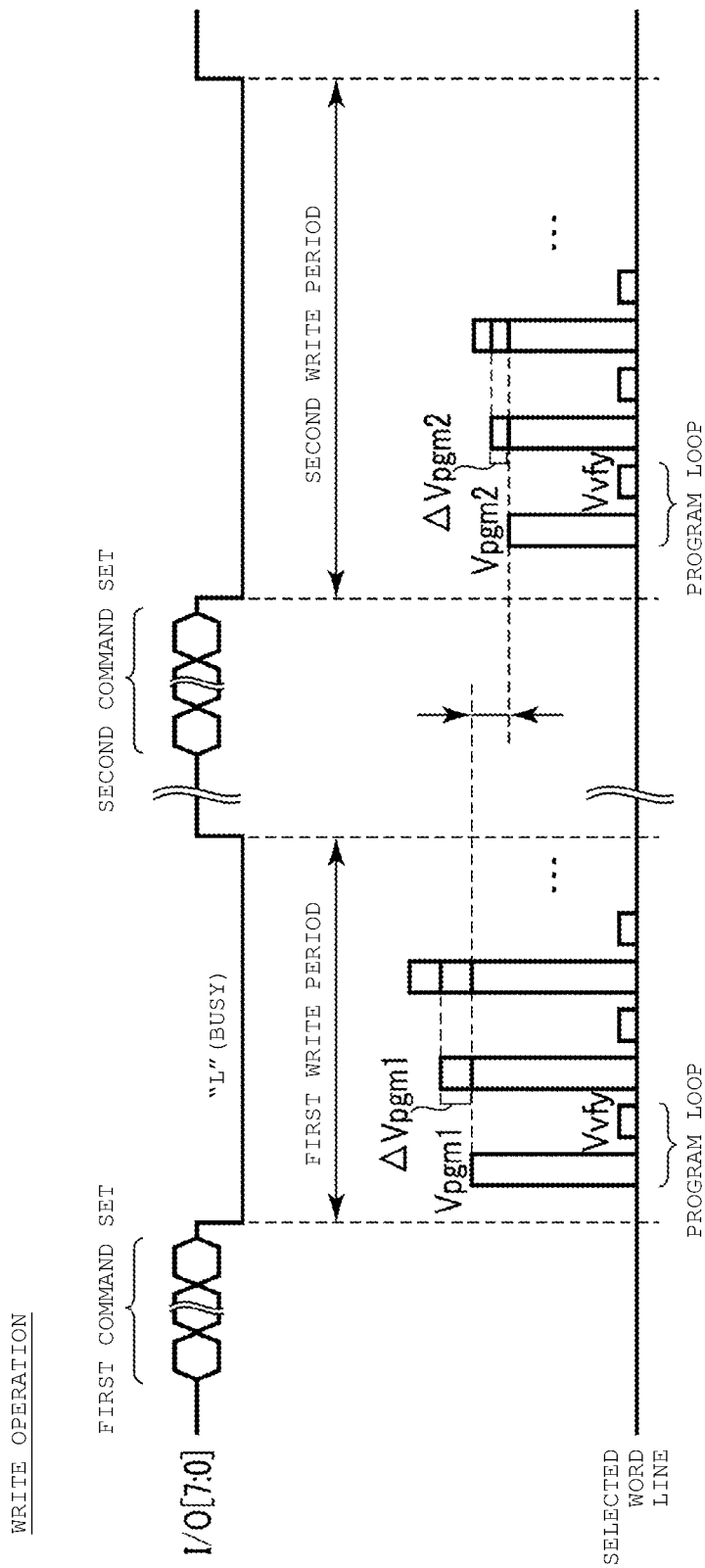
FIG. 15 is a timing chart illustrating voltages of selected word lines during the first and second write operations in the semiconductor storage device according to the first embodiment.

Next, a description will be made of an example of a voltage of the selected word line WL in the first and second write operations. FIG. 15 illustrates voltages applied to the selected word line WL in the first and second write operations.

As illustrated in FIG. 15, after the first command set is received, first, the row decoder 16 applies a voltage Vpmg1 to the selected word line WL in the first write period tProg1. The voltage Vpgm1 is the program voltage VPGM in the first write operation. If the voltage Vpgm1 is applied to the selected word line WL, a threshold voltage of the memory cell transistor MT which is connected to the selected word line WL and is a "0" program target increases, and a threshold voltage of the memory cell transistor MT which is a "1" program target does not increase (or barely increases). Next, the row decoder 16 applies a voltage Vvfy. The voltage Vvfy is a verification voltage, and is, for example, the voltage VM1 illustrated in FIG. 5.

The above-described operation of applying the program voltage and the verification voltage corresponds to one program loop. The program loop is repeated while increasing a value of the program voltage by ΔVpgm1. A value of the voltage Vvfy applied in each program loop is changed to, for example, the voltage VM2 or VM3 with the progress of the first write operation. A plurality of types of verification voltages may be used in a single program loop. For example, if verification using the voltage VMF is passed, the sequencer 14 finishes the first write operation, and sets the ready/busy signal RBn to an "H" level.

Next, after the second command set is received, the row decoder 16 applies a voltage Vpgm2 to the selected word line WL in the second write period tProg2 in the same manner as in the first write period tProg1. The voltage Vpgm2 is the voltage VPGM in the second write operation. Next, the row decoder 16 applies the voltage Vvfy. For example, the row decoder 16 applies the voltage V1 illustrated in FIG. 6 to the selected word line WL as the voltage Vvfy. The program loop is repeated while increasing a value of the program voltage by ΔVpgm2 until verification is passed. The voltage Vpgm2 is lower than the voltage Vpgm1, and ΔVpgm2 is lower than ΔVpgm1. As mentioned above, in the second write operation, a threshold voltage of the memory cell transistor MT is finely controlled by using a program voltage and Δvoltage Vpgm lower than those in the first write operation. Thus, the second write period tProg2 tends to be longer than the first write period tProg1.

1.4 Effect Related to Present Embodiment

According to the configuration of the present embodiment, it is possible to improve reliability of a semiconductor storage device. This effect will be described in detail.

A threshold voltage of the memory cell transistor MT into which data is written may change due to disturbance during a write operation on the adjacent memory cell transistor MT or a write operation on another string unit SU.

In contrast, in the configuration of the present embodiment, a write operation for a plurality of bits is divided into two operations, and, first, the first write operation is performed on the memory cell transistor MT connected to the word line WLi, the first write operation is performed on the memory cell transistor MT connected to the word line WL(i+1), and then the second write operation is performed on the memory cell transistor MT connected to the word line WLi. Consequently, even if the memory cell transistor MT connected to the word line WLi receives disturbance due to the first write operation on the memory cell transistor MT connected to the adjacent word line WL(i+1), data can be finely written thereinto through the subsequent second write operation, and thus it is possible to reduce the influence of disturbance.

When focusing on a threshold voltage of data in the "0" level (erasing level), a threshold voltage of data in the "M0" level of the memory cell transistor MT subjected to the first write operation does not reach the "1" level due to the influence of the "1" program, but is slightly higher than a threshold voltage of data in the "ER" level of the memory cell transistor MT not subjected to the first write operation. Thus, in the memory cell transistor MT subjected to the first write operation, a failure bit in the "0" level, that is, shift from the "0" level to the "1" level more easily occurs than in the memory cell transistor MT not subjected to the first write operation, due to disturbance from other string units SU. FIG. 16 illustrates a relationship between a data writing order and disturbance caused by the second write operation on other string units SU. FIG. 16 illustrates an order of selecting the string units SU in the word lines WL0 and WL1, and a selection order is the same as in FIG. 11.

As illustrated in FIG. 16, when focusing on the memory cell group MCG connected to the word line WL1 of the string unit SU0, in the fifth operation after the first write operation is performed, the first write operation of selecting the word line WL1 and the second write operation of selecting the word line WL0 are performed in an order of the string units SU1, SU2, and SU3. Therefore, the memory cell group MCG connected to the word line WL1 of the string unit SU0 receives the influence of disturbance three times due to the second write operation on the other string units SU in which the word line WL0 is selected. Similarly, the memory cell group MCG connected to the word line WL1 of the string unit SU1 receives the influence of disturbance twice. The memory cell group MCG connected to the word line WL1 of the string unit SU2 receives the influence of disturbance once. The memory cell group MCG connected to the word line WL1 of the string unit SU3 does not receive the influence of disturbance. As mentioned above, a change amount of a threshold voltage caused by disturbance differs depending on a selection order for the string units SU on which the first write operation is performed in the word line WL(i+1), in other words, a selection order for the string units SU on which the second write operation is performed in the word line WLi. As the number of times of receiving disturbance increases, a threshold voltage also increases, and thus the number of failure bits tends to increase.

For example, in each word line WL, in a case where the string units SU on which the first write operation and the second write operation are performed are selected in an order of the string units SU0, SU1, SU2, and su3, failure bits in the "0" level concentrates on the string unit SU0. If the number of failure bits increases to the degree of not being capable of relieving the failure bits through an ECC process, reading failure occurs, and thus reliability of data reading deteriorates.

In contrast, according to the configuration of the present embodiment, a selection order for the string units SU on which the first and second write operations are performed can be shifted for each word line WL. Consequently, the number of times of disturbance received from other string units SU can be leveled. A specific example is illustrated in FIG. 17. FIG. 17 illustrates the number of times of disturbance received due to the second write operation in the memory cell group MCG of other string units SU to which the word lines WL of the next lower number are connected for each memory cell group MCG in the data writing order described in FIG. 11.

As illustrated in FIG. 17, when focusing on the word lines WL1 to WL4, a selection order for the string units SU on which the first and second write operations are performed is shifted, and thus the number of receiving disturbance is six times regardless of the string unit SU such that the influence of disturbance is leveled. This is also the same for other word lines WL.

Consequently, the number of failure bits of data in the "0" level in each string unit SU can be distributed evenly. Therefore, a possibility of being capable of relieving failure bits through an ECC process is increased, and thus it is possible to reduce wrong reading. Therefore, it is possible to improve reliability of a semiconductor storage device.

2. Second Embodiment

Next, a second embodiment will be described. In the second embodiment, a description will be made of three examples of a selection order for the string units SU, which is different from the first embodiment. Hereinafter, only a difference from the first embodiment will be described.

2.1 First Example

First, with reference to FIG. 18, a first example of the second embodiment will be described.

Figure 18:
FIG. 18 is a diagram illustrating an order of the second write operation for a word line group of a semiconductor storage device according to a first example of a second embodiment.

As illustrated in FIG. 18, it is assumed that a certain word line group WG includes word lines WLi to WL(i+3). Then, in a case of the word line WLi, the second write operation is performed in an order of the string units SU0, SU1, SU2, and SU3. In a case of the word line WL(i+1), the initial string unit SU is shifted from the string unit SU0 to the string unit SU3, and the second write operation is performed in an order of the string units SU3, SU0, SU1, and SU2. In a case of the word line WL(i+2), the initial string unit SU is shifted from the string unit SU3 to the string unit SU2, and the second write operation is performed in an order of the string units SU2, SU3, SU0, and SU1. In a case of the word line WL(i+3), the initial string unit SU is shifted from the string unit SU2 to the string unit SU1, and the second write operation is performed in an order of the string units SU1, SU2, SU3, and SU0.

2.2 Second Example

Next, with reference to FIG. 19, a second example of the second embodiment will be described.

Figure 19:
FIG. 19 is a diagram illustrating an order of the second write operation for the word line group of the semiconductor storage device according to a second example of the second embodiment.

As illustrated in FIG. 19, it is assumed that a certain word line group WG includes word lines WLi to WL(i+3). Then, in a case of the word line WLi, the second write operation is performed in an order of the string units SU0, SU1, SU2, and SU3. In a case of the word line WL(i+1), the initial string unit SU is shifted from the string unit SU0 to the string unit SU2, and the second write operation is performed in an order of the string units SU2, SU3, SU0, and SU1. In a case of the word line WL(i+2), the initial string unit SU is shifted from the string unit SU2 to the string unit SU3, and the second write operation is performed in an order of the string units SU3, SU0, SU1, and SU2. In a case of the word line WL(i+3), the initial string unit SU is shifted from the string unit SU3 to the string unit SU1, and the second write operation is performed in an order of the string units SU1, SU2, SU3, and SU0.

2.3 Third Example

Next, with reference to FIG. 20, a third example of the second embodiment will be described. In the third example, a description will be made of a case where selection orders for a plurality of string units SU are combined with each other.

Figure 20:
FIG. 20 is a diagram illustrating an order of the second write operation for the word line group of the semiconductor storage device according to a third example of the second embodiment.

As illustrated in FIG. 20, the selection order for the string units SU described in the first example is applied to a certain word line group WGj (where j is any integer), and the selection order for the string units SU described in the second example is applied to the word line group WG(j+1).

Any combination of selection orders for a plurality of string units SU may be used. For example, the selection order for the string units SU described in the first embodiment and the selection order for the string units SU described in the first example may be combined with each other.

2.4 Effect Related to Present Embodiment

According to the configuration of the present embodiment, the same effect as in the first embodiment can be achieved.

A selection order for the string units SU is not limited to the first and second embodiments. In a single word line group WG, any selection order may be set as long as the respective string units SU are selected for the first time, for the second time, for the third time, and for the fourth time.

Instead of changing a selection order for the respective string units SU in the unit of the word line group WG, the number of times of selecting the respective string units SU may be leveled by performing writing on all word lines (for example, the word lines WL0 to WL95).

3. Third Embodiment

Next, a third embodiment will be described. In the third embodiment, a description will be made of a data reading order in a case where a single block BLK is divided into a lower block BLK and an upper block BLK. Hereinafter, only a difference from the first and second embodiments will be described.

3.1 Data Writing Order

With reference to FIG. 21, a data writing order will be described. In the present embodiment, a set of the memory cell transistors MT connected to the word lines WL0 to WL47 is referred to as a lower block BLK, and a set of the memory cell transistors MT connected to the word lines WL48 to WL95 is referred to as an upper block BLK. The controller 20 separately manages a data write operation in the lower block BLK and the upper block BLK.

As illustrated in FIG. 21, in a case where data is written into the lower block BLK, the sequencer 14 writes the data from the word line WL47 toward the word line WL0.

More specifically, the sequencer 14 performs the first write operation of selecting the word line WL47 and sequentially selecting the string units SU0 to SU3 as first to fourth operations in the lower block BLK.

Next, as fifth and sixth operations, the sequencer 14 performs the first write operation of selecting the string unit SU0, and selecting the word line WL46, and the second write operation of selecting the word line WL47. As seventh to twelfth operations, the sequencer 14 sequentially selects the string units SU1 to SU3, and alternately performs the first write operation of and selecting the word line WL46 and the second write operation of selecting the word line WL47 in the same process as in the fifth and sixth operations.

As thirteenth to twentieth operations, the sequencer 14 alternately performs the first write operation of selecting the word line WL45 for each string unit SU and the second write operation of selecting the word line WL46 in the same manner as in the fifth to twelfth operations. In the thirteenth to twentieth operations, the string units SU1, SU2, SU3, and SU0 are selected in this order. In other words, the string unit SU which is initially selected is shifted from SU0 to SU1.

Next, the sequencer 14 performs twenty-first to twenty-eighth operations of selecting the word lines WL44 and WL45 in the same manner as in the fifth to twelfth operations. In the twenty-first to twenty-eighth operations, the string units SU2, SU3, SU0, and SU1 are selected in this order. In other words, the string unit SU which is initially selected is shifted from SU1 to SU2.

Next, the sequencer 14 performs twenty-ninth to thirty-sixth operations of selecting the word lines WL43 and WL44 in the same manner as in the fifth to twelfth operations. In the twenty-ninth to thirty-sixth operations, the string units SU3, SU0, SU1, and SU2 are selected in this order. In other words, the string unit SU which is initially selected is shifted from SU2 to SU3.

Similarly, the sequencer 14 initially selects the string unit SU0 in thirty-seventh to forty-fourth operations of selecting the word lines WL42 and WL43, and initially selects the string unit SU1 in forty-fifth to fifty-second operations of selecting the word lines WL41 and WL42. The same applies to the subsequent processes.

As described above, the sequencer 14 performs the write operation on the basis of the address information ADD and the data DAT transmitted from the controller 20.

In other words, when the sequencer 14 is caused to perform the write operation, the controller 20 designates the page address PA such that the string unit SU on which the second write operation is initially performed is repeatedly shifted in an order of the string units SU0, SU1, SU2, and SU3 from the word line WL47 to the word line WL0. In other words, when the sequencer 14 is caused to perform the write operation, the controller 20 designates the page address PA such that the string unit SU on which the first write operation is initially performed is repeatedly shifted in an order of the string units SU0, SU1, SU2, and SU3 from the word line WL46 to the word line WL0.

In a case where data is written into the upper block BLK, the sequencer 14 writes the data from the word line WL48 toward the word line WL95. A data writing order is the same as in FIG. 11 of the first embodiment, and the word line WL48 in FIG. 21 corresponds to the word line WL0 in FIG. 11.

3.2 Effect Related to Present Embodiment

According to the configuration of the present embodiment, the same effect as in the first embodiment can be achieved.

The selection order for the string units SU described in the second embodiment may be applied to the lower block BLK and the upper block BLK.

4. Fourth Embodiment

Next, a fourth embodiment will be described. In the fourth embodiment, a description will be made of first and second embodiments which are different from those in the first embodiment. Hereinafter, only a difference from the first to third embodiments will be described.

4.1 Threshold Voltage Distribution in Memory Cell Transistor MT

First, with reference to FIG. 22, a description will be made of a threshold voltage distribution in the memory cell transistor MT. In the present embodiment, a description will be made of a case where coding which is different from that in the first embodiment.

Figure 22:
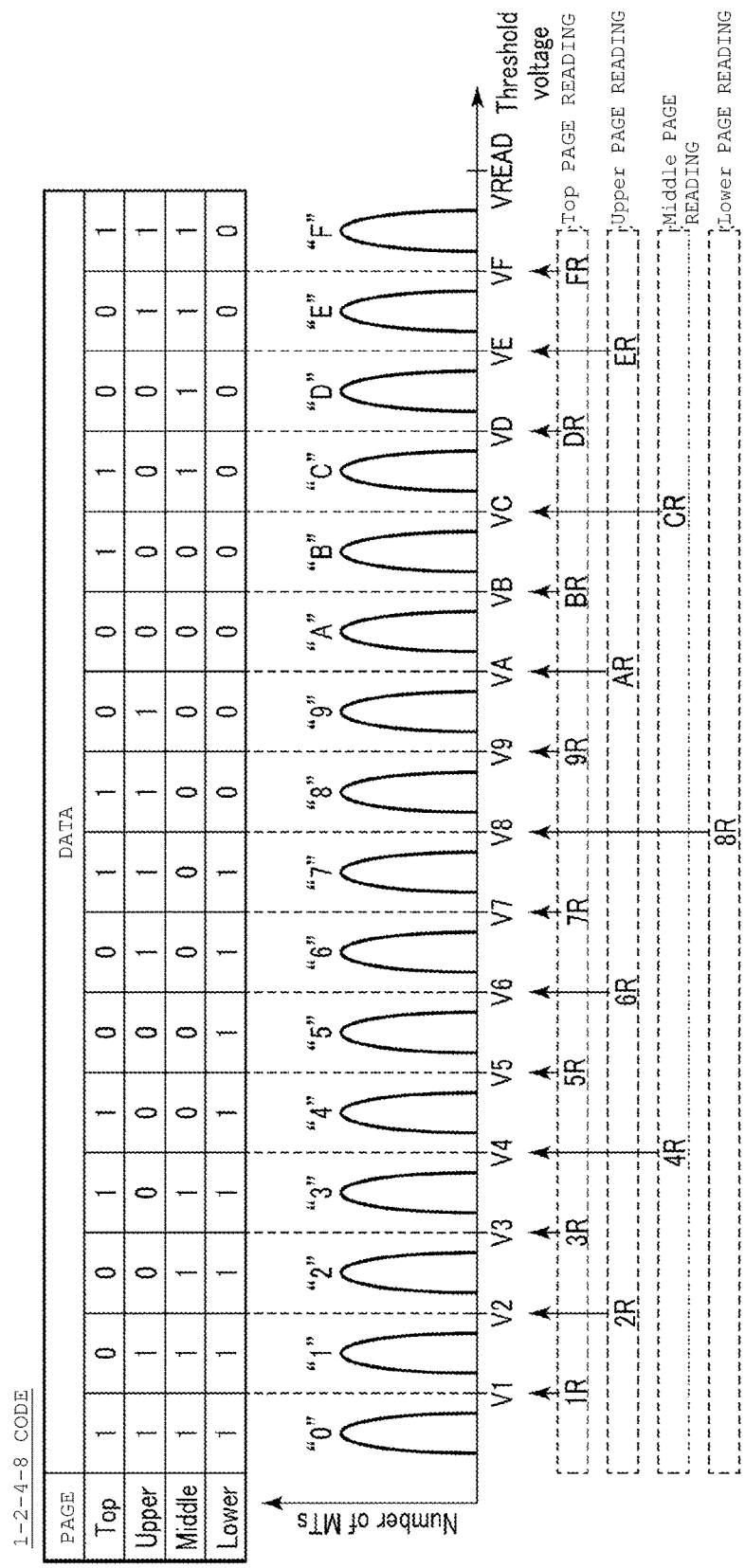
FIG. 22 is a diagram illustrating data allocation, a threshold voltage distribution, and a read level in a memory cell transistor of a semiconductor storage device according to a fourth embodiment.

As illustrated in FIG. 22, data is allocated to "lower bit/middle bit/upper bit/top bit" so as to be expressed as follows with respect to the memory cell transistor MT included in each level.

The memory cell transistor MT included in the "0" level holds data of "1111". The memory cell transistor MT included in the "1" level holds data of "1110". The memory cell transistor MT included in the "2" level holds data of "1100". The memory cell transistor MT included in the "3" level holds data of "1101". The memory cell transistor MT included in the "4" level holds data of "1001". The memory cell transistor MT included in the "5" level holds data of "1000". The memory cell transistor MT included in the "6" level holds data of "1010". The memory cell transistor MT included in the "7" level holds data of "1011". The memory cell transistor MT included in the "8" level holds data of "0011". The memory cell transistor MT included in the "9" level holds data of "0010". The memory cell transistor MT included in the "A" level holds data of "0000". The memory cell transistor MT included in the "B" level holds data of "0001". The memory cell transistor MT included in the "C" level holds data of "0101". The memory cell transistor MT included in the "D" level holds data of "0100". The memory cell transistor MT included in the "E" level holds data of "0110". The memory cell transistor MT included in the "F" level holds data of "0111".

In a case where the data allocated as mentioned above is read, a lower bit is determined through the read operations 8R. A middle bit is determined through the read operations 4R and CR. An upper bit is determined through the read operations 2R, 6R, AR, and ER. A top bit is determined through the read operations 1R, 3R, 5R, 7R, 9R, BR, DR, and FR. In other words, the lower bit, the middle bit, the upper bit, and the top bit are respectively determined through one, two, four, and eight read operations. Hereinafter, this data allocation will be referred to as a "1-2-4-8 code".

4.2 First and Second Write Operations

Next, a write operation of the present embodiment will be described. In the present embodiment, a write operation for 4-page data is performed to be divided into two operations such as a first write operation of writing a lower page and a middle page and a second write operation of writing an upper page and a top page.

First, with reference to FIG. 23, the first write operation will be described.

Figure 23:
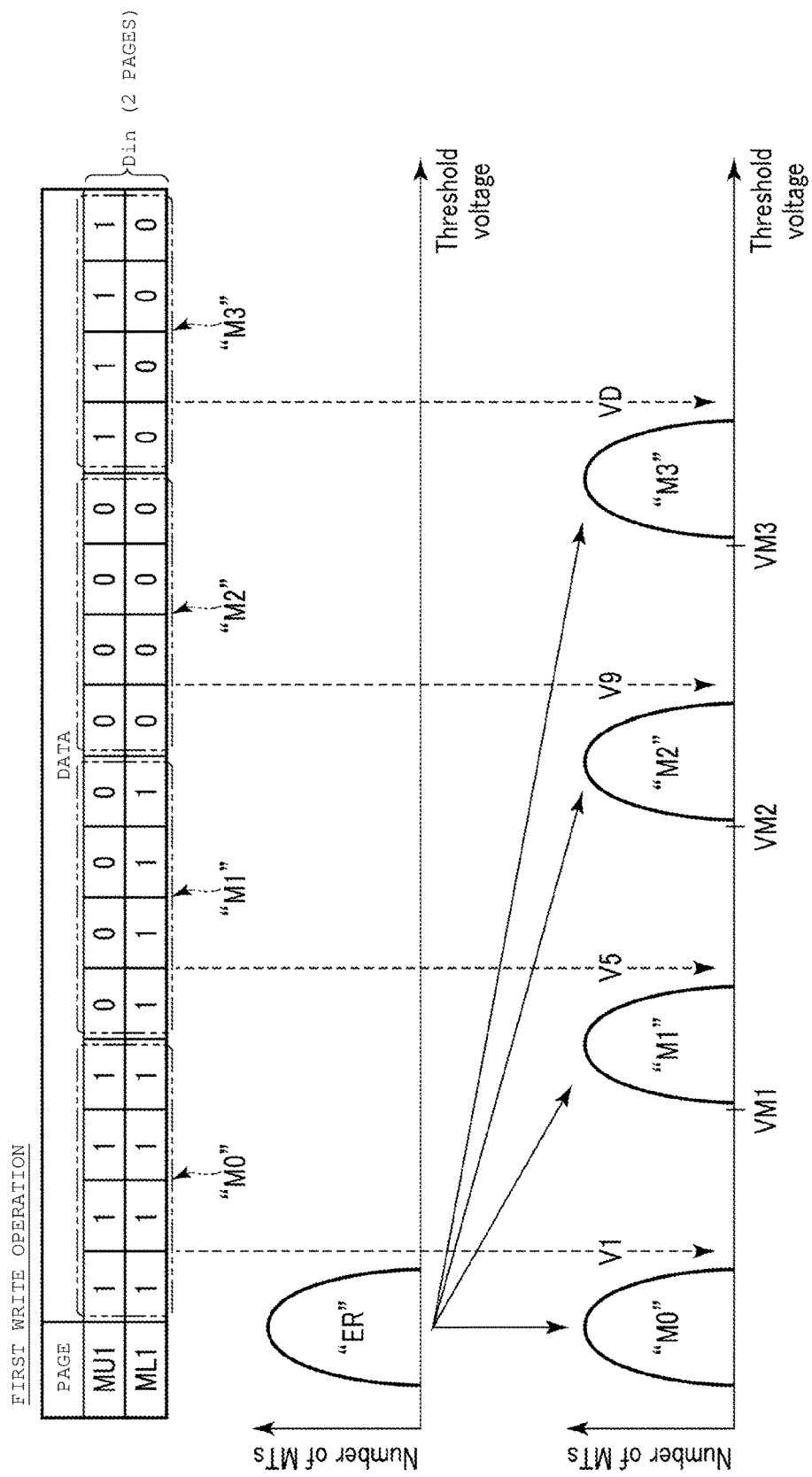
FIG. 23 is a diagram illustrating a change in a threshold voltage distribution in a memory cell transistor due to the first write operation in the semiconductor storage device according to the fourth embodiment.

As illustrated in FIG. 23, the sequencer 14 performs the first write operation on the basis of lower page data and middle page data which are input from the controller 20.

More specifically, the sequencer 14 uses voltages VM1, VM2, and VM3 as verification voltages. The voltage VM1 is used to write data of "10" ("lower bit/upper bit"), and is equal to or higher than the voltage V1 and is lower than the voltage V5. The voltage VM2 is a verification voltage used to write data of "00", and is equal to or higher than the voltage V5 and is lower than the voltage V9. The voltage VM3 is a verification voltage used to write data of "01", and is equal to or higher than the voltage V9 and is lower than the voltage VD.

If the first write operation is performed, a threshold voltage of the memory cell transistor MT is increased on the basis of written data, and four threshold voltage distributions are formed. An "M0" level illustrated in FIG. 23 is formed by a plurality of memory cell transistors MT into which the data of "11" is written. An "M1" level is formed by a plurality of memory cell transistors MT into which the data of "10" is written. An "M2" level is formed by a plurality of memory cell transistors MT into which the data of "00" is written. An "M3" level is formed by a plurality of memory cell transistors MT into which the data of "01" is written.

A threshold voltage in the "M0" level is lower than the voltage V1. A threshold voltage in the "M1" level is equal to or higher than the voltage VM1 and is lower than the voltage V5. A threshold voltage in the "M2" level is equal to or higher than the voltage VM2 and is lower than the voltage V9. A threshold voltage in the "M3" level is equal to or higher than the voltage VM3 and is lower than the voltage VD.

Next, the second write operation will be described with reference to FIG. 24.

Figure 24:
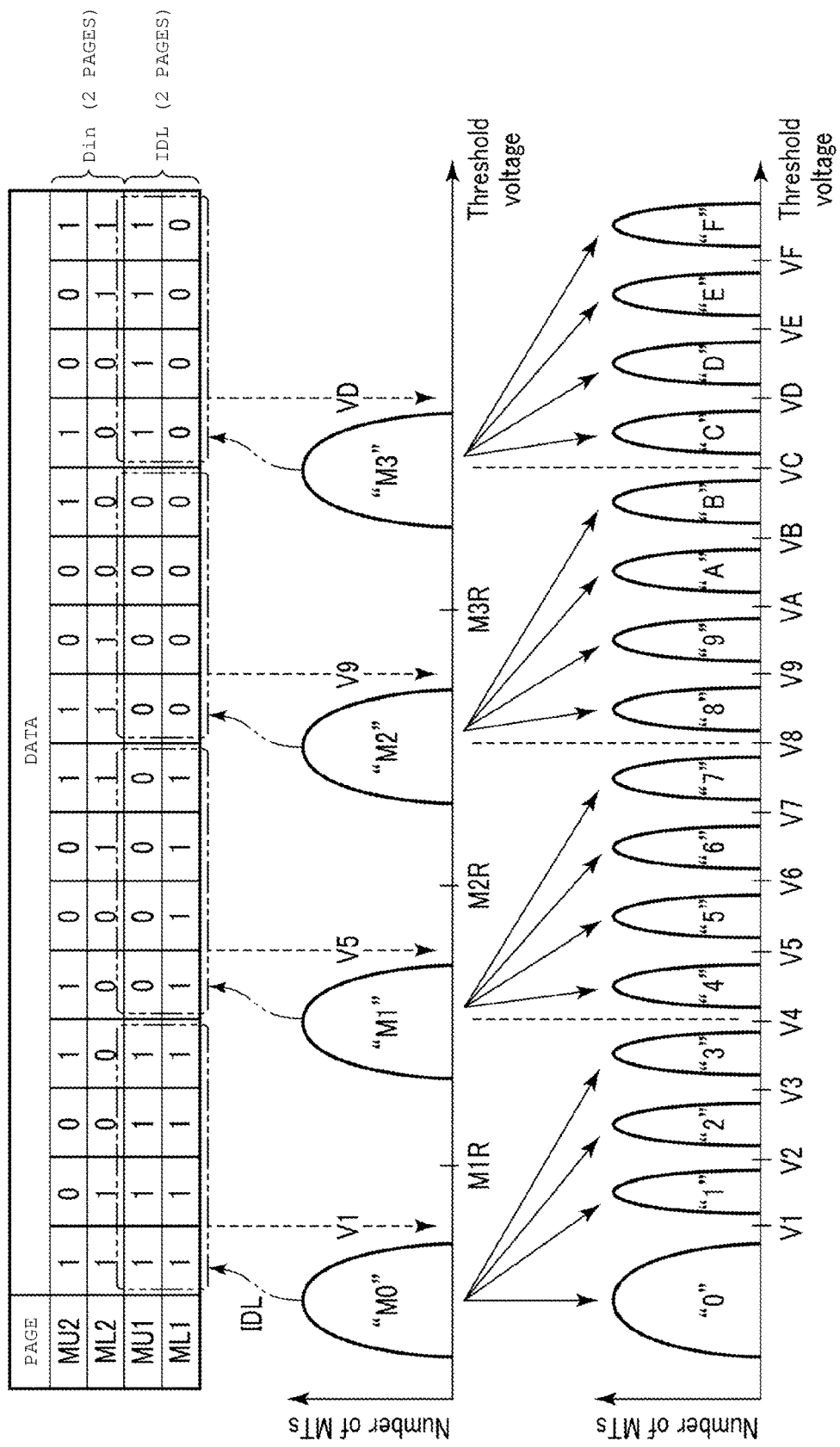
FIG. 24 is a diagram illustrating a change in a threshold voltage distribution in the memory cell transistor due to the second write operation in the semiconductor storage device according to the fourth embodiment.

As illustrated in FIG. 24, first, the sequencer 14 performs the second write operation on the basis of lower page data and the middle page data read from the memory cell array 11, that is, data of "11", data of "10", data of "00", and data of "01", and upper page data and the top page data which are input from the controller 20.

In the second write operation, for example, threshold voltage distributions in the "0" level, the "1" level, the "2" level, and the "3" level are formed from a threshold voltage distribution in the "M0" level. Threshold voltage distributions in the "4" level, the "5" level, the "6" level, and the "7" level are formed from a threshold voltage distribution in the "M1" level. Threshold voltage distributions in the "8" level, the "9" level, the "A" level, and the "B" level are formed from a threshold voltage distribution in the "M2" level. Threshold voltage distributions in the "C" level, the "D" level, the "E" level, and the "F" level are formed from a threshold voltage distribution in the "M3" level.

4.3 Effect Related to Present Embodiment

According to the configuration of the present embodiment, the same effect as in the first embodiment can be achieved.

5. Fifth Embodiment

Next, a fifth embodiment will be described. In the fifth embodiment, a description will be made of a case where 4-page data is written through three write operations. Hereinafter, only a difference from the first to fourth embodiments will be described.

5.1 First to Third Write Operations

First, a description will be made of a write operation of the present embodiment. In the present embodiment, writing of 4-page data is performed to be divided into three operations such as a first write operation in which data is temporarily written in a level lower than the "8" level into the memory cell transistors MT into which data is written in the "8" level, the "9" level, the "A" level, the "B" level, the "C" level, the "D" level, the "E" level, and the "F" level, a second write operation in which the coarse write operation (corresponding to the first write operation in the first embodiment) described in the first embodiment is performed, and a third write operation in which the fine write operation (corresponding the second write operation in the first embodiment) described in the first embodiment is performed.

Figure 25:
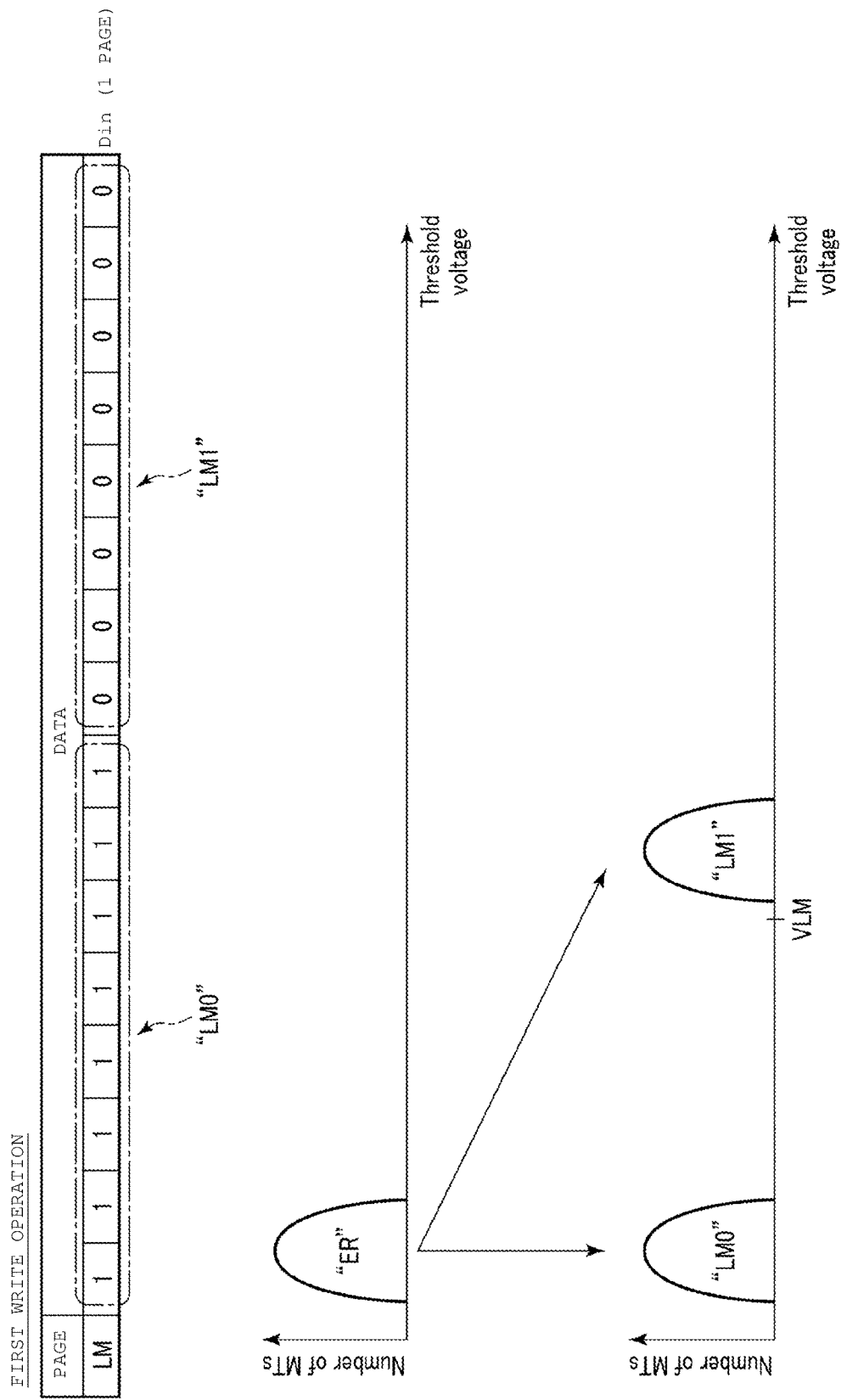
FIG. 25 is a diagram illustrating a change in a threshold voltage distribution in a memory cell transistor due to the first write operation in a semiconductor storage device according to a fifth embodiment.

First, the first write operation will be described with reference to FIG. 25. FIG. 25 illustrates a change in a threshold voltage distribution in the memory cell transistor MT due to the first write operation.

As illustrated in FIG. 25, the sequencer 14 performs the first write operation on the basis of LM data which is input from the controller 20.

More specifically, the controller 20 creates LM data having, data of "1111", data of "0111", data of "0101", data of "0001", data of "1001", data of "1000", data of "0000", data of "0100" as data of "0", and data of "0110", data of "0010", data of "0011", data of "1011", data of "1010", data of "1110", data of "1100", data of "1101" as data of "1", and transmits the LM data to the semiconductor storage device 10. In a case where 4-page data corresponds to the 1-2-4-8 code, the controller 20 may transmit lower page data.

In the first write operation, the sequencer 14 uses the voltage VLM as a verification voltage. The voltage VLM is, for example, equal to or higher than the voltage V5 and is lower than the voltage VM8.

Figure 26:
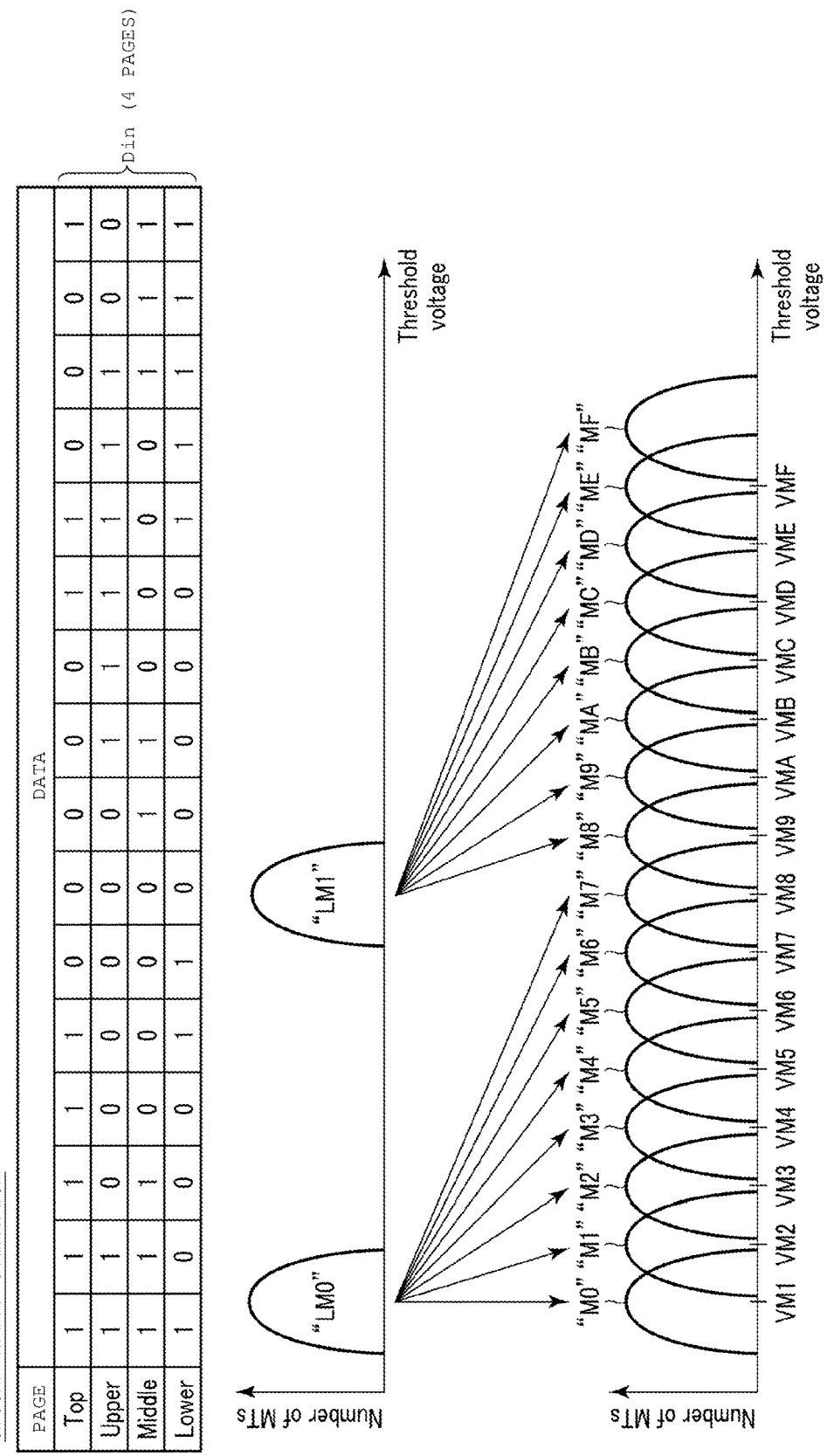
FIG. 26 is a diagram illustrating a change in a threshold voltage distribution in the memory cell transistor due to the second write operation in the semiconductor storage device according to the fifth embodiment.

If the first write operation is performed, a threshold voltage of the memory cell transistor MT is increased on the basis of written data, and two threshold voltage distributions are formed. An "LM0" level illustrated in FIG. 26 is formed by a plurality of memory cell transistors MT corresponding to the data of "1". An "LM1" level is formed by a plurality of memory cell transistors MT corresponding to the data of "0".

A threshold voltage in the "LM0" level is lower than the voltage V1. A threshold voltage in the "LM1" level is equal to or higher than the voltage VLM and is lower than the voltage V8.

Next, the second write operation will be described with reference to FIG. 26. FIG. 26 illustrates a change in a threshold voltage distribution of the memory cell transistor MT due to the second write operation.

As illustrated in FIG. 26, the second write operation is the coarse write operation (corresponding to the first write operation in the first embodiment) described in the first embodiment. A difference from the first embodiment is that threshold voltage distributions in the respective levels are formed from a threshold voltage distribution in the "ER" level in the first embodiment. In contrast, in the present embodiment, for example, an "M0" level, an "M1" level, an "M2" level, an "M3" level, an "M4" level, an "M5" level, an "M6" level, and an "M7" level are formed from a threshold voltage distribution in the "LM0" level, and an "M8" level, an "M9" level, an "MA" level, an "MB" level, an "MC" level, an "MD" level, an "ME" level, and an "MF" level are formed from a threshold voltage distribution in the "LM1" level.

Figure 27:
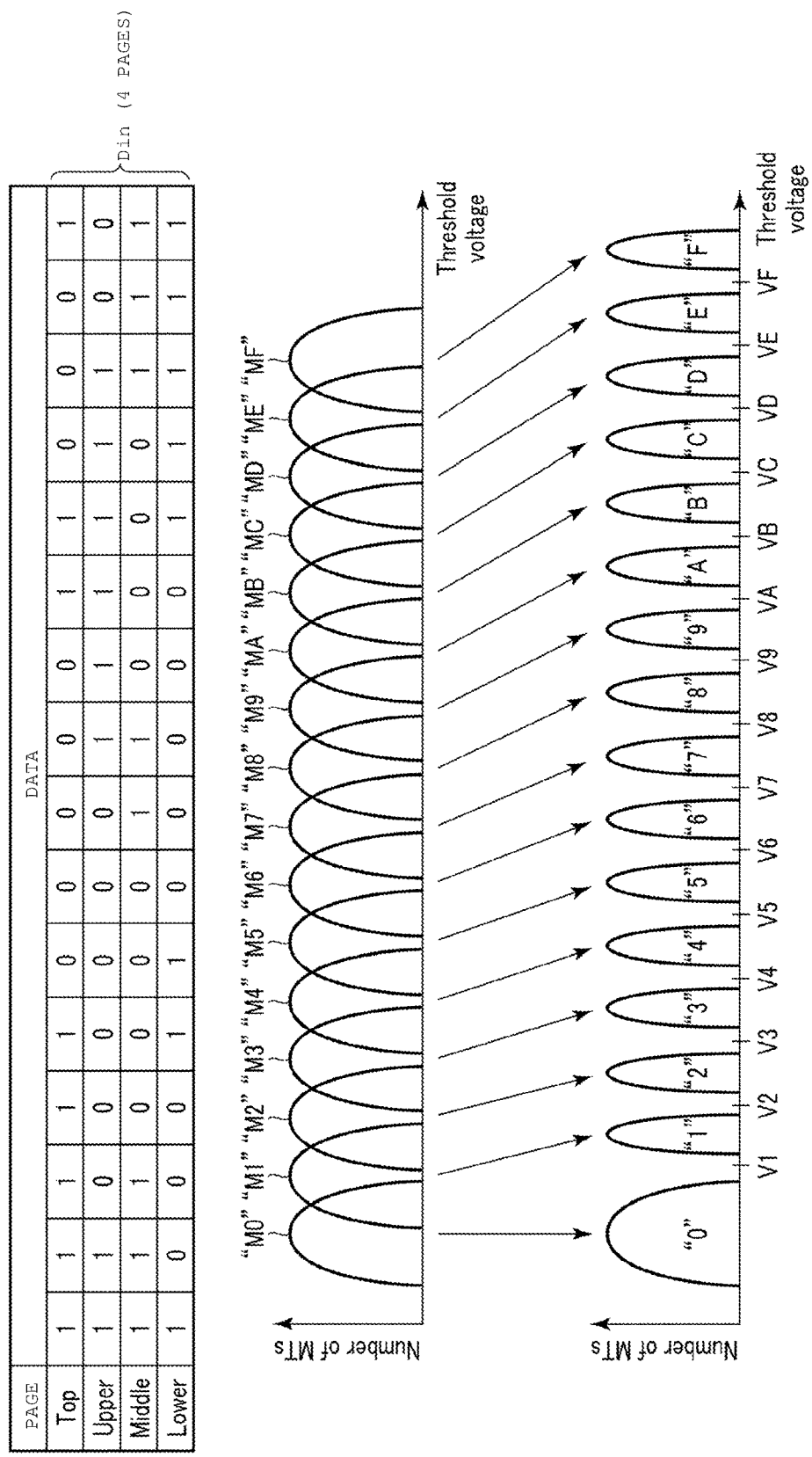
FIG. 27 is a diagram illustrating a change in a threshold voltage distribution in the memory cell transistor due to a third write operation in the semiconductor storage device according to the fifth embodiment.

Next, with reference to FIG. 27, the third write operation will be described. FIG. 27 illustrates a change in a threshold voltage distribution in the memory cell transistor MT due to the third write operation.

As illustrated in FIG. 27, the third write operation is the same as the fine write operation (corresponding to the second write operation in the first embodiment) described in the first embodiment.

5.2 Data Writing Order

Figure 28:
FIG. 28 is a diagram illustrating an order of writing data into a block of the semiconductor storage device according to the fifth embodiment.

Next, a description will be made of a data writing order with reference to FIG. 28. FIG. 28 illustrates an order of selecting the string unit SU in a single block BLK. A solid line rectangular frame which corresponds to the word line WL and the string unit SU and is partitioned into an upper part, an intermediate part, and a lower part by dashed lines indicates a single memory cell group MCG, the upper part of the rectangular frame indicates the third write operation (reference sign "WRT3"), the intermediate part of the rectangular frame indicates the second write operation (reference sign "WRT2"), and the lower part of the rectangular frame indicates the first write operation (reference sign "WRT1").

As illustrated in FIG. 28, as first to fourth operations, the sequencer 14 performs the first write operation of selecting the word line WL0, and sequentially selecting the string units SU0 to SU3.

Next, as fifth to ninth operations, the sequencer 14 performs the first write operation of selecting the string unit SU0 and selecting the word line WL1, the second write operation of selecting the word line WL0, the first write operation of selecting the word line WL2, the second write operation of selecting the word line WL1, and the third write operation of selecting the word line WL0.

Next, as tenth to twenty-fourth operations, the sequencer 14 sequentially selects the string units SU1 to SU3, and repeatedly performs the first write operation of selecting the word line WL1, the second write operation of selecting the word line WL0, the first write operation of selecting the word line WL2, the second write operation of selecting the word line WL1, and the third write operation of selecting the word line WL0 in the same procedure as in the fifth to ninth operations. In other words, when focusing on the word line WL0, the string unit SU0 is selected as the string unit SU on which the third write operation is performed.

Next, as twenty-fifth to twenty-seventh operations, the sequencer 14 selects the string unit SU1, and performs the first write operation of selecting the word line WL3, the second write operation of selecting the word line WL2, and the third write operation of selecting the word line WL1.

Next, as twenty-eighth to thirty-sixth operates, the sequencer 14 sequentially selects the string units SU2, SU3, and SU0, and repeatedly performs the first write operation of selecting the word line WL3, the second write operation of selecting the word line WL2, and the third write operation of selecting the word line WL1, in the same procedure as in the twenty-fifth to twenty-seventh operations. In other words, in the word line WL1, the string unit SU which is initially selected for the third write operation is shifted from SU0 to SU1.

Next, the sequencer 14 performs thirty-seventh to forty-eighth operations of selecting the word lines WL4, WL3, and WL2 in the same manner as in the twenty-fifth to thirty-sixth operations. In the thirty-seventh to forty-eighth operations, the string units SU2, SU3, SU0, and SU1 are selected in this order. In other words, in the word line WL2, the string unit SU which is initially selected for the third write operation is shifted from SU1 to SU2.

Next, the sequencer 14 performs forty-ninth to sixtieth operations of selecting the word lines WL5, WL4, and WL3 in the same manner as in the twenty-fifth to thirty-sixth operations. In the forty-ninth to sixtieth operations, the string units SU3, SU0, SU1, and SU2 are selected in this order. In other words, in the word line WL3, the string unit SU which is initially selected for the third write operation is shifted from SU2 to SU3.

Next, the sequencer 14 performs sixty-first to seventy-second operations of selecting the word lines WL6, WL5, and WL4 in the same manner as in the twenty-fifth to thirty-sixth operations. In the sixty-first to seventy-second operations, the string units SU0, SU1, SU2, and SU3 are selected in this order. In other words, in the word line WL4, the string unit SU which is initially selected for the third write operation is shifted from SU3 to SU0. The same applies to the subsequent processes.

That is, the sequencer 14 repeatedly shifts the string units SU on which the third write operation is initially performed in an order of the string units SU0, SU1, SU2, and SU3 from the word line WL0 to the word line WL95. In other words, the sequencer 14 repeatedly shifts the string units SU on which the second write operation is initially performed in an order of the string units SU0, SU1, SU2, and SU3 from the word line WL2 to the word line WL95. Alternatively, the sequencer 14 repeatedly shifts the string units SU on which the first write operation is initially performed in an order of the string units SU0, SU1, SU2, and SU3 from the word line WL3 to the word line WL95.

Therefore, in the same manner as in FIG. 11 of the first embodiment, a cycle of the string units SU to be selected every four word lines WL is repeated so as to correspond to the four string units SU. In the example illustrated in FIG. 28, when focusing on an order of the string unit SU on which the third write operation is initially performed, four word lines WL0 to WL3 are set as a word line group WG0. The same applies to the subsequent word lines WL.

5.3 Effect Related to Present Embodiment

According to the configuration of the present embodiment, the same effect as in the first embodiment can be achieved.

In the present embodiment, the selection orders in the second and third embodiments may be applied to a selection order of the string units SU.

In a case where the memory cell transistor MT corresponds to a TLC holding 3-bit data, so-called "page-by-page" writing may be performed such that the first write operation, the second write operation, and the third write operation in the present embodiment respectively correspond to a lower page write operation, a middle page write operation, and an upper page write operation. Also in this case, the first write operation, the second write operation, and the third write operation are performed in the order illustrated in FIG. 28. That is, the string units SU on which an upper page write operation (third write operation) is initially performed are repeatedly shifted in an order of the string units SU0, SU1, SU2, and SU3 from the word line WL0 to the word line WL95. In other words, the string units SU on which a middle page write operation (second write operation) is initially performed are repeatedly shifted in an order of the string units SU0, SU1, SU2, and SU3 from the word line WL2 to the word line WL95. Alternatively, the string units SU on which a lower page write operation (first write operation) is initially performed are repeatedly shifted in an order of the string units SU0, SU1, SU2, and SU3 from the word line WL3 to the word line WL95.

6. Sixth Embodiment

Next, a sixth embodiment will be described. A difference from the first embodiment is that, in the sixth embodiment, among the memory cell transistors MT0 to MT95 in the NAND string NS, the memory cell transistors MT0 and MT95 disposed at both ends correspond to a single-level cell (SLC) holding 1-bit data, and the other memory cell transistors MT1 to MT94 correspond to a QLC. Hereinafter, only a difference from the first to fifth embodiments will be described.

6.1 Data Writing Order

Figure 29:
FIG. 29 is a diagram illustrating an order of writing data into a block of a semiconductor storage device according to a sixth embodiment.

A data writing order will be described with reference to FIG. 29. FIG. 29 illustrates an order of selecting the string unit SU in a single block BLK. A solid line rectangular frame which corresponds to the word line WL and the string unit SU indicates a single memory cell group MCG. The memory cell groups MCG connected to the word lines WL0 and wL95 can hold 1-page data, and thus data is written thereinto through one write operation. Data is written into the memory cell groups MCG connected to the word lines WL1 to WL94 through two write operations. Thus, the rectangular frame indicating the memory cell group MCG is partitioned into an upper part and a lower part by a dashed line, the upper part indicates the second write operation, and the lower part indicates the first write operation. In the example illustrated in FIG. 29, for simplification of description, a writing number of data which is written last in the block BLK is indicated by k (where k=760).

As illustrated in FIG. 29, as first to fourth operations, the sequencer 14 performs the first write operation for 1-page data of selecting the word line WL0, and sequentially selecting the string units SU0 to SU3.

Next, as fifth to eighth operations, the sequencer 14 performs the first write operation of selecting the word line WL0, and sequentially selecting the string units SU0 to SU3.

Next, as ninth and tenth operations, the sequencer 14 performs the first write operation of selecting the string unit SU0 and selecting the word line WL2 and the second write operation of selecting the word line WL1. Next, as eleventh to sixteenth operations, the sequencer 14 sequentially selects the string units SU1 to SU3, and alternately performs the first write operation of selecting the word line WL2 and the second write operation of selecting the word line WL1 in the same procedure as in the ninth and tenth operations.

Next, as seventeenth to twenty-fourth operations, the sequencer 14 alternately performs the first write operation of selecting the word line WL3 and the second write operation of selecting the word line WL2 for each string unit SU in the same procedure as in the ninth to sixteenth operations. In the seventeenth to twenty-fourth operations, the string units SU1, SU2, SU3, and SU0 are selected in this order. In other words, the string unit SU which is initially selected is shifted from SU0 to SU1.

Subsequently, the sequencer 14 performs a write operation while shifting the initially selected string unit SU.

Next, as (k–23)-th to (k–16)-th operations, the sequencer 14 alternately performs the first write operation of selecting the word line WL93 and the second write operation of selecting the word line WL92 for each string unit SU in the same procedure as in the ninth to sixteenth operations. In the (k–23)-th to (k–16)-th operations, the string units SU3, SU0, SU1, and SU2 are selected in this order.

Next, as (k–15)-th to (k–8)-th operations, the sequencer 14 alternately performs the first write operation of selecting the word line WL94 and the second write operation of selecting the word line WL93 for each string unit SU in the same procedure as in the ninth to sixteenth operations. In the (k–15)-th to (k–8)-th operations, the string units SU0, SU1, SU2, and SU3 are selected in this order.

Next, as (k–7)-th to k-th operations, the sequencer 14 alternately performs the write operation for 1-page data of selecting the word line WL95 and the second write operation of selecting the word line WL94 for each string unit SU in the same procedure as in the ninth to sixteenth operations. In the (k–7)-th to k-th operations, the string units SU1, SU2, SU3, and SU0 are selected in this order. In other words, the string unit SU which is initially selected is shifted from SU0 to SU1.

6.2 Effect Related to Present Embodiment

According to the configuration of the present embodiment, the same effect as in the first embodiment can be achieved.

According to the configuration of the present embodiment, since the memory cell transistors MT0 and MT95 located at both ends of the NAND string NS correspond to 1-bit data writing, it is possible to reduce wrong reading in the memory cell transistor MT and thus to improve reliability of a read operation.

In the sixth embodiment, as an example, the memory cell transistors MT0 and MT95 disposed at both ends of the NAND string NS are SLCs, and the other memory cell transistors MT1 to MT94 are QLCs, but this is only an example. The number of bits of data which can be held in the memory cell transistors MT0 and MT95 disposed at both ends of the NAND string NS may be smaller than the number of bits of data which can be held in the other memory cell transistors MT1 to MT94. For example, in a case where the memory cell transistors MT1 to MT94 are QLCs, the memory cell transistors MT0 and MT95 may not be SLCs, and may be MLCs or TLCs.

In the present embodiment, the second to fifth embodiments may be applied.

7. Seventh Embodiment

Next, a seventh embodiment will be described. In the seventh embodiment, a description will be made of a case where the memory cell transistors MT0, MT47, MT48, and MT95 disposed at both ends are SLCs in each of the upper block BLK and the lower block BLK in the third embodiment. Hereinafter, only a difference from the first to sixth embodiments will be described.

7.1 Data Writing Order

A data writing order will be described with reference to FIG. 30. In the example illustrated in FIG. 30, for simplification of description, a writing number of data which is written last in the upper block BLK and the lower block BLK is indicated by k (where k=376).

As illustrated in FIG. 30, in a case where data is written into the lower block BLK, the sequencer 14 writes data from the word line WL47 toward the word line WL0.

More specifically, as first to fourth operations, the sequencer 14 performs the write operation for 1-page data of selecting the word line WL47, and sequentially selecting the string units SU0 to SU3.

Next, as fifth to eighth operations, the sequencer 14 performs the first write operation of selecting the word line WL46, and sequentially selecting the string units SU0 to SU3.

Next, as ninth and tenth operations, the sequencer 14 performs the first write operation of selecting the string unit SU0 and selecting the word line WL45 and the second write operation of selecting the word line WL46. Next, as eleventh to sixteenth operations, the sequencer 14 sequentially selects the string units SU1 to SU3, and alternately performs the first write operation of selecting the word line WL45 and the second write operation of selecting the word line WL46 in the same procedure as in the ninth and tenth operations.

Next, as seventeenth to twenty-fourth operations, the sequencer 14 alternately performs the first write operation of selecting the word line WL44 and the second write operation of selecting the word line WL45 for each string unit SU in the same procedure as in the ninth to sixteenth operations. In the seventeenth to twenty-fourth operations, the string units SU1, SU2, SU3, and SU0 are selected in this order. In other words, the string unit SU which is initially selected is shifted from SU0 to SU1.

Subsequently, the sequencer 14 performs a write operation while shifting the initially selected string unit SU.

Next, as (k−23)-th to (k−16)-th operations, the sequencer 14 alternately performs the first write operation of selecting the word line WL2 and the second write operation of selecting the word line WL3 for each string unit SU in the same procedure as in the ninth to sixteenth operations. In the (k−23)-th to (k−16)-th operations, the string units SU3, SU0, SU1, and SU2 are selected in this order.

Next, as (k−15)-th to (k−8)-th operations, the sequencer 14 alternately performs the first write operation of selecting the word line WL1 and the second write operation of selecting the word line WL2 for each string unit SU in the same procedure as in the ninth to sixteenth operations. In the (k−15)-th to (k−8)-th operations, the string units SU0, SU1, SU2, and SU3 are selected in this order.

Next, as (k−7)-th to k-th operations, the sequencer 14 alternately performs the write operation for 1-page data of selecting the word line WL0 and the second write operation of selecting the word line WL1 for each string unit SU in the same procedure as in the ninth to sixteenth operations. In the (k−7)-th to k-th operations, the string units SU1, SU2, SU3, and SU0 are selected in this order. In other words, the string unit SU which is initially selected is shifted from SU0 to SU1.

In a case where data is written into the upper block BLK, the sequencer 14 writes data from the word line WL48 toward the word line WL95. A data writing order is the same as in FIG. 29 of the sixth embodiment, and the word line WL48 in FIG. 30 corresponds to the word line WL0 in FIG. 29.

7.2 Effect Related to Present Embodiment

According to the configuration of the present embodiment, the same effect as in the first and sixth embodiments can be achieved.

In the seventh embodiment, as an example, the memory cell transistors MT0, MT47, MT48, and MT95 disposed at both ends of the upper block BLK and the lower block BLK are SLCs, and the other memory cell transistors MT1 to MT46 and MT49 to MT94 are QLCs, but this is only an example. The number of bits of data which can be held in the memory cell transistors MT0, MT47, MT48, and MT95 disposed at both ends of the upper block BLK and the lower block BLK may be smaller than the number of bits of data which can be held in the other memory cell transistors MT1 to MT46 and MT49 to MT94. For example, in a case where the memory cell transistors MT1 to MT46 and MT49 to MT94 are QLCs, the memory cell transistors MT0, MT47, MT48, and MT95 may not be SLCs, and may be MLCs or TLCs.

8. Modification Example

The semiconductor storage device according to the embodiment includes a first memory unit (SU0) including a first memory string (NS) having first to third memory cells (MT0 to MT2) and a first select transistor (ST1), a second memory unit (SU1) including a second memory string (NS) having fourth to sixth memory cells (MT0 to MT2) and a second select transistor (ST1), a third memory unit (SU2) including a third memory string (NS) having seventh to ninth memory cells (MT0 to MT2) and a third select transistor (ST1), a first word line (WL0) connected to gates of the first, fourth, and seventh memory cells (MT0), a second word line (WL1) connected to gates of the second, fifth, and eighth memory cells (MT1), a third word line (WL2) connected to gates of the third, sixth, and ninth memory cells (MT2), first to third select gate lines (SGD0 to SGD2) respectively connected to the first to third select transistors, and a row decoder (16) connected to the first to third word lines and the first to third select gate lines. Each of the first to ninth memory cells can hold data of a plurality of bits, and a write operation for data of a plurality of bits includes a first write operation and a second write operation. In the write operation, in a case where the second write operation is performed on any of the first, fourth, and seventh memory cells connected to the first word line, the first memory cell is initially selected, in a case where the second write operation is performed on any of the second, fifth, and eighth memory cells connected to the second word line, the fifth memory cell is initially selected, and, in a case where the second write operation is performed on any of the third, sixth, and ninth memory cells connected to the third word line, the ninth memory cell is initially selected.

By applying the embodiment, it is possible to provide a semiconductor storage device capable of improving reliability.

An embodiment is not limited to the embodiments described above, and may be variously modified.

For example, in the embodiments, the NAND flash memory may be a planer NAND flash memory in which the memory cell transistors MT are arranged in a two-dimensional manner on a semiconductor substrate, and may be a three-dimensional stacked NAND flash memory in which the memory cell transistors MT are stacked on a semiconductor substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor storage device comprising:
 a first memory string having first, second, and third memory cells and a first select transistor;
 a second memory string having fourth, fifth, and sixth memory cells and a second select transistor;

a third memory string having seventh, eighth, and ninth memory cells and a third select transistor;
a first word line that is connected to gates of the first, fourth, and seventh memory cells;
a second word line that is connected to gates of the second, fifth, and eighth memory cells;
a third word line that is connected to gates of the third, sixth, and ninth memory cells;
first, second, and third select gate lines that are respectively connected to the first, second, and third select transistors; and
a row decoder that is connected to the first, second, and third word lines and the first, second, and third select gate lines,
wherein a write operation for writing n-bit data in the memory cells, where n is two or more, includes a first write operation and a second write operation, and
wherein, in the second write operation performed on the memory cells connected to the first word line, the first memory cell is initially selected, in the second write operation performed on the memory cells connected to the second word line, the fifth memory cell is initially selected, and, in the second write operation performed on the memory cells connected to the third word line, the ninth memory cell is initially selected.

2. The semiconductor storage device according to claim 1, wherein
the second write operation is performed on the memory cells connected to the first word line in an order of the first memory cell, the fourth memory cell, and the seventh memory cell,
the second write operation is performed on the memory cells connected to the second word line in an order of the fifth memory cell, the eighth memory cell, and the second memory cell, and
the second write operation is performed on the memory cells connected to the third word line in an order of the ninth memory cell, the third memory cell, and the sixth memory cell.

3. The semiconductor storage device according to claim 2, wherein
the first write operation on the second memory cell and the second write operation on the first memory cell are sequentially performed, and
the first write operation on the sixth memory cell and the second write operation on the fifth memory cell are sequentially performed.

4. The semiconductor storage device according to claim 3, wherein
in the first write operation performed on the memory cells connected to the second word line, the second memory cell is initially selected, and
in the first write operation performed on the memory cells connected to the third word line, the sixth memory cell is initially selected.

5. The semiconductor storage device according to claim 1, wherein the first write operation is a coarse write operation and the second write operation is a fine write operation.

6. The semiconductor storage device according to claim 1, wherein the write operation further includes another write operation prior to the first write operation.

7. The semiconductor storage device according to claim 1, wherein the first, second, and third memory strings are a part of first, second, and third string units, and the second string unit is between the first and third string units.

8. The semiconductor storage device according to claim 1, wherein the first, second, and third word lines are stacked above a substrate in an order of the first, second, and third word lines.

9. The semiconductor storage device according to claim 1, wherein the first, second, and third word lines are stacked above a substrate in an order of the third, second, and first word lines.

10. A memory system comprising a semiconductor storage device and a controller, wherein the semiconductor storage device includes:
a first memory string having first, second, and third memory cells and a first select transistor;
a second memory string having fourth, fifth, and sixth memory cells and a second select transistor;
a third memory string having seventh, eighth, and ninth memory cells and a third select transistor;
a first word line that is connected to gates of the first, fourth, and seventh memory cells;
a second word line that is connected to gates of the second, fifth, and eighth memory cells;
a third word line that is connected to gates of the third, sixth, and ninth memory cells;
first, second, and third select gate lines that are respectively connected to the first, second, and third select transistors; and
a row decoder that is connected to the first, second, and third word lines and the first, second, and third select gate lines,
wherein a write operation for writing n-bit data in the memory cells, where n is two or more, includes a first write operation and a second write operation, and
wherein, in the second write operation performed on the memory cells connected to the first word line, the first memory cell is initially selected, in the second write operation performed on the memory cells connected to the second word line, the fifth memory cell is initially selected, and, in the second write operation performed on the memory cells connected to the third word line, the ninth memory cell is initially selected.

11. The memory system according to claim 10, wherein
the second write operation is performed on the memory cells connected to the first word line in an order of the first memory cell, the fourth memory cell, and the seventh memory cell,
the second write operation is performed on the memory cells connected to the second word line in an order of the fifth memory cell, the eighth memory cell, and the second memory cell, and
the second write operation is performed on the memory cells connected to the third word line in an order of the ninth memory cell, the third memory cell, and the sixth memory cell.

12. The memory system according to claim 11, wherein
the first write operation on the second memory cell and the second write operation on the first memory cell are sequentially performed, and
the first write operation on the sixth memory cell and the second write operation on the fifth memory cell are sequentially performed.

13. The memory system according to claim 12, wherein
in the first write operation performed on the memory cells connected to the second word line, the second memory cell is initially selected, and
in the first write operation performed on the memory cells connected to the third word line, the sixth memory cell is initially selected.

14. The memory system according to claim 10, wherein the first write operation is a coarse write operation and the second write operation is a fine write operation.

15. The memory system according to claim 10, wherein the write operation further includes another write operation prior to the first write operation.

16. The memory system according to claim 10, wherein the first, second, and third memory strings are a part of first, second, and third string units, and the second string unit is between the first and third string units.

17. The memory system according to claim 10, wherein the first, second, and third word lines are stacked above a substrate in an order of the first, second, and third word lines.

18. The memory system according to claim 10, wherein the first, second, and third word lines are stacked above a substrate in an order of the third, second, and first word lines.

19. A method of performing a write operation on a semiconductor storage device including a first memory string having first, second, and third memory cells and a first select transistor, a second memory string having fourth, fifth, and sixth memory cells and a second select transistor, a third memory string having seventh, eighth, and ninth memory cells and a third select transistor, a first word line that is connected to gates of the first, fourth, and seventh memory cells, a second word line that is connected to gates of the second, fifth, and eighth memory cells, a third word line that is connected to gates of the third, sixth, and ninth memory cells, first, second, and third select gate lines that are respectively connected to the first, second, and third select transistors, and a row decoder that is connected to the first, second, and third word lines and the first, second, and third select gate lines, said method comprising:

writing n-bit data in the memory cells, where n is two or more, by performing a first write operation and a second write operation, wherein in the second write operation performed on the memory cells connected to the first word line, the first memory cell is initially selected, in the second write operation performed on the memory cells connected to the second word line, the fifth memory cell is initially selected, and in the second write operation performed on the memory cells connected to the third word line, the ninth memory cell is initially selected.

20. The method according to claim 19, wherein the first write operation is a coarse write operation and the second write operation is a fine write operation.

* * * * *